US011637356B1

United States Patent
Presswala et al.

(10) Patent No.: US 11,637,356 B1
(45) Date of Patent: Apr. 25, 2023

(54) DYNAMIC GATE-OVERDRIVE VOLTAGE BOOST RECEIVER

(71) Applicant: QUALCOMM Incorporated, San Diego, CA (US)

(72) Inventors: Aliasgar Presswala, Woodland Hills, CA (US); Wilson Jianbo Chen, San Diego, CA (US); Chiew-Guan Tan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/649,526

(22) Filed: Jan. 31, 2022

(51) Int. Cl.
*H03K 19/0185* (2006.01)
*H01P 5/12* (2006.01)
*H02M 3/155* (2006.01)

(52) U.S. Cl.
CPC ............. *H01P 5/12* (2013.01); *H02M 3/155* (2013.01)

(58) Field of Classification Search
None
See application file for complete search history.

(56) References Cited

U.S. PATENT DOCUMENTS

| 8,008,975 | B1 | 8/2011 | Allen et al. |
| 9,735,763 | B1* | 8/2017 | Chen ................. H03K 19/0175 |
| 10,484,041 | B2* | 11/2019 | Ekambaram ... H03K 19/018521 |
| 10,700,683 | B1* | 6/2020 | Chen ................ H03K 19/00369 |
| 10,790,025 | B2 | 9/2020 | Yamaoka |
| 10,892,760 | B1* | 1/2021 | Rao ................. H03K 19/017509 |
| 2010/0141345 | A1 | 6/2010 | Nabicht |
| 2011/0235827 | A1 | 9/2011 | Lesso et al. |
| 2021/0208617 | A1 | 7/2021 | Strydom |

* cited by examiner

*Primary Examiner* — Jeffery S Zweizig
(74) *Attorney, Agent, or Firm* — Loza & Loza, LLP

(57) ABSTRACT

In certain aspects, a receiving circuit includes a splitter, a first receiver, a second receiver, and a boost circuit. The splitter is configured to receive an input signal, split the input signal into a first signal and a second signal, output the first signal to the first receiver, and output the second signal to the second receiver. In certain aspects, the voltage swing of the input signal is split between the first signal and the second signal. The boost circuit may be configured to shift a supply voltage of the second receiver to boost a gate-overdrive voltage of a transistor in the second receiver during a transition of the input signal (e.g., transition from low to high). In certain aspects, the boost circuit controls the gate-overdrive voltage boosting based on the first signal and the second signal.

30 Claims, 11 Drawing Sheets

DYNAMIC GATE-OVERDRIVE VOLTAGE BOOST RECEIVER

BACKGROUND

Field

Aspects of the present disclosure relate generally to receivers, and more particularly, to receivers with gate-overdrive voltage boosting.

Background

A chip may include a receiver to receive an input signal from an off-chip device via a link. In some cases, the voltage swing of the input signal exceeds a voltage rating of transistors in the receiver. This can damage the transistors in the receiver. To prevent overvoltage damage to the transistors, split receivers have been developed. A split receiver may include a first receiver and a second receiver. To prevent overvoltage damage, the split receiver splits the voltage swing of the input signal between the first receiver and the second receiver, which reduces the voltage stress on the transistors in each of the first receiver and the second receiver.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a receiving circuit. The receiving circuit includes a splitter having a first output and a second output, wherein the splitter is configured to receive an input signal, split the input signal into a first signal and a second signal, output the first signal at the first output, and output the second signal at the second output. The receiving circuit also includes a first receiver having an input and an output, wherein the input of the first receiver is coupled to the first output of the splitter, and a second receiver having an input and an output, wherein the input of the second receiver is coupled to the second output of the splitter. The receiving circuit further includes a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver.

A second aspect relates to a receiving circuit. The receiving circuit includes a splitter having a first output and a second output, wherein the splitter is configured to receive an input signal, split the input signal into a first signal and a second signal, output the first signal at the first output, and output the second signal at the second output. The receiving circuit also includes a first receiver having an input and an output, wherein the input of the first receiver is coupled to the first output of the splitter, and a second receiver having an input and an output, wherein the input of the second receiver is coupled to the second output of the splitter. The receiving circuit also includes a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver. The receiving circuit further includes a second boost circuit having a first input, a second input, and an output, wherein the first input of the second boost circuit is coupled to the input of the first receiver, the second input of the second boost circuit is coupled to the input of the second receiver, and the output of the second boost circuit is coupled to a supply terminal of the first receiver.

A third aspect relates to a method of receiving an input signal. The method includes splitting the input signal into a first signal and a second signal, inputting the first signal to a first receiver, inputting the second signal to a second receiver, and shifting a supply voltage of the second receiver based on the first signal and the second signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts.

A chip may include a receiver to receive an input signal from an off-chip device via a link. The input of the receiver may be coupled to the link via an input/output (I/O) pad on the chip. In some cases, the voltage swing (e.g., 1.8V) of the input signal exceeds a voltage rating (e.g., 1.2V) of transistors in the receiver. The voltage rating of a transistor is a maximum voltage that the transistor is designed to tolerate between two terminals (e.g., gate-to-source). A transistor may be damaged (e.g., suffer a gate-oxide breakdown) when a voltage across the transistor exceeds the voltage rating of the transistor. As used herein, a "voltage swing" of a signal is the difference between the maximum voltage of the signal and the minimum voltage of the signal.

In certain aspects, a receiver may include transistors having a voltage rating below the voltage swing of an input signal received by the receiver. To prevent the input signal from damaging the transistors, split receiver designs have been developed. In this regard, FIG. 1 shows an example of a split receiver 110 configured to receive a high-voltage input signal without damaging the transistors in the split receiver 110.

Figure 1:
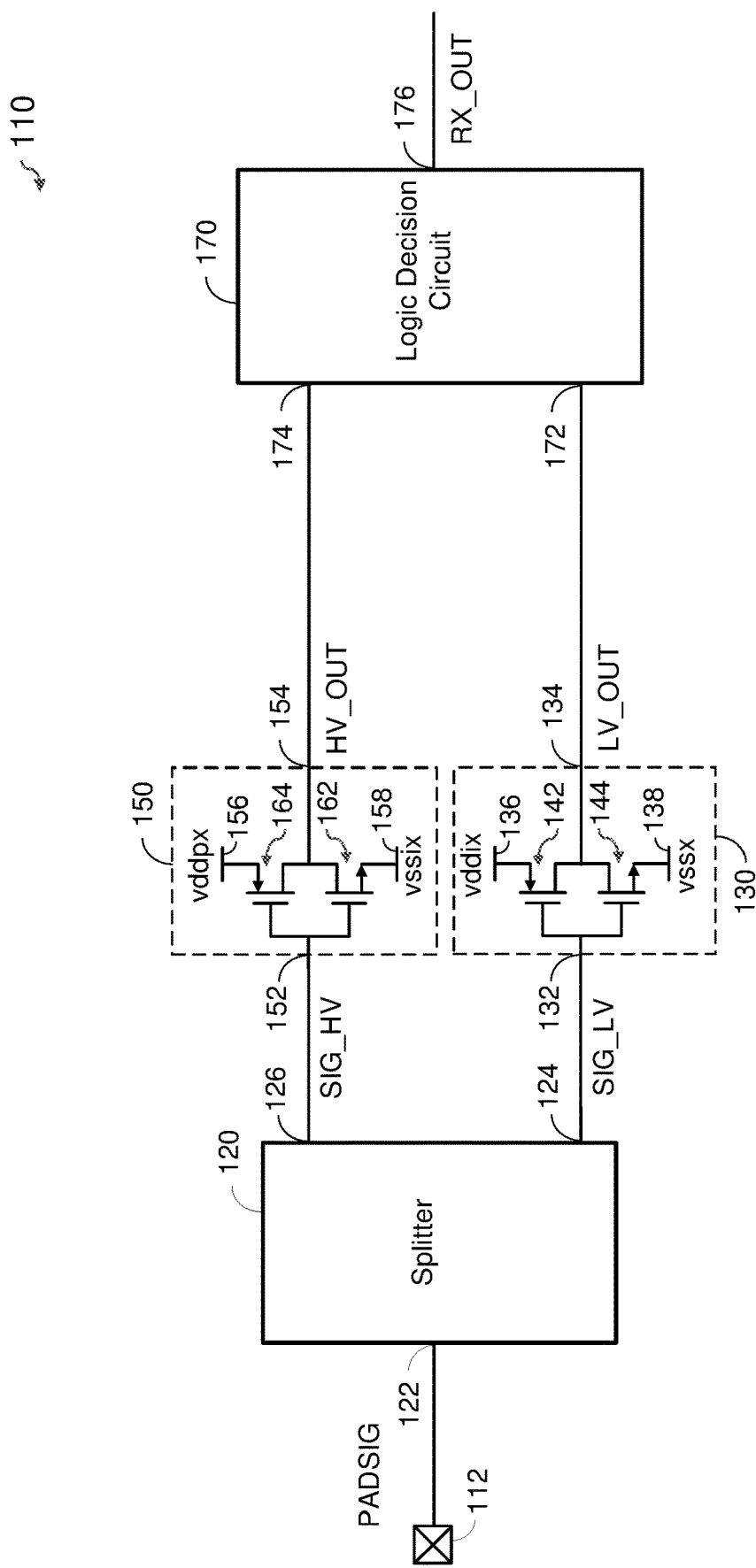
FIG. 1 shows an example of a split receiver according to certain aspects of the present disclosure.

In the example in FIG. 1, the split receiver 110 includes a splitter 120, a first receiver 130, a second receiver 150, and a logic decision circuit 170. The splitter 120 has an input 122, a first output 124, and a second output 126. The input 122 of the splitter 120 is coupled to an I/O pad 112 to receive the input signal (labeled "PADSIG"). The input signal may be transmitted from an off-chip device (not shown) coupled to the I/O pad 112 via a link (not shown).

The splitter 120 is configured to split the input signal into a first signal (labeled "SIG_LV") and a second signal (labeled "SIG_HV"). The first signal is output at the first output 124 and the second signal is output at the second output 126. In certain aspects, the input signal has a first voltage swing (e.g., 1.8 V), the first signal has a second voltage swing (e.g., 0.9 V), and the second signal has a third voltage swing (e.g., 0.9 V), in which each one of the second voltage swing and the third voltage swing is less than the first voltage swing. Thus, in this example, the splitter 120 splits the voltage swing of the input signal between the first signal and the second signal. As discussed further below, the lower voltage swings of the first signal and the second signal provide overvoltage protection for transistors in the first receiver 130 and the second receiver 150.

Figure 2:
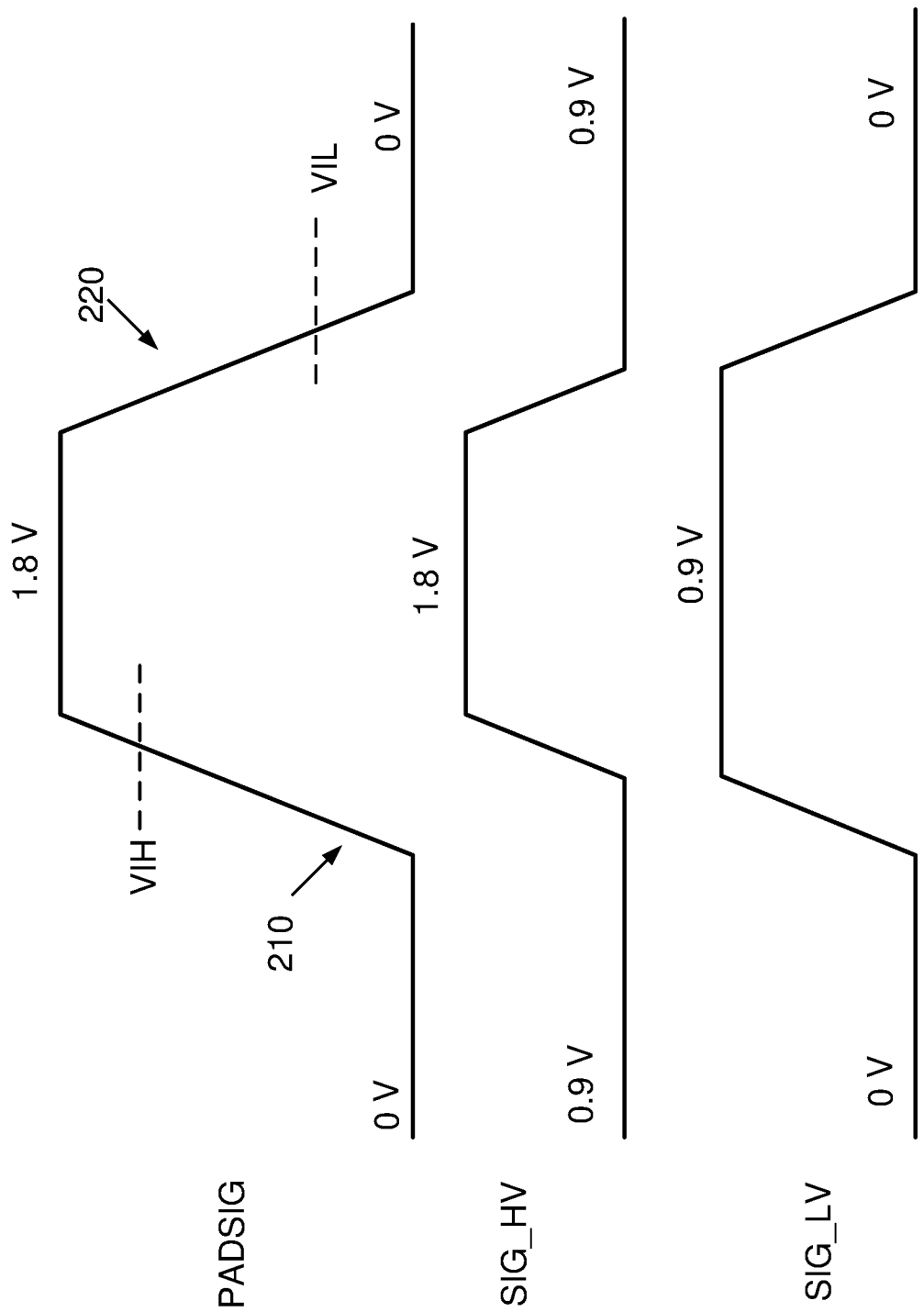
FIG. 2 shows an example of voltage waveforms in the split receiver according to certain aspects of the present disclosure.

FIG. 2 shows exemplary voltage waveforms for the input signal (labeled "PADSIG"), the first signal (labeled "SIG_LV") and the second signal (labeled "SIG_HV"). In this example, the input signal has a voltage swing of 1.8 V, the first signal has a voltage between 0 V to 0.9 V, and the second signal has a voltage between 0.9 V to 1.8 V. However, it is to be appreciated that the present disclosure is not limited to this example.

As shown in the example in FIG. 2, the first signal includes the portion of the input signal between 0 V and 0.9 V, and the second signal includes the portion of the input signal between 0.9 V and 1.8 V. Also, the voltage of the first signal is 0.9 V when the voltage of the input signal is above 0.9 V, and the voltage of the second signal is 0.9 V when the voltage of the input signal is below 0.9 V. In other words, the first signal chops off the portion of the input signal above 0.9 V, and the second signal chops off the portion of the input signal below 0.9 V. In this example, the voltage swing of the first signal is 0.9 V and the voltage swing of the second signal is 0.9 V (i.e., 1.8 V-0.9 V). Assuming the voltage rating (e.g., 1.2 V) of transistors in the split receiver 110 is above 0.9 V, the voltage swing of each one of the first signal and the second signal is below the voltage rating of the transistors in the split receiver 110, which protects the transistors from overvoltage damage. As also shown in FIG. 2, the voltage of the second signal SIG_HV is higher than the voltage of the first signal SIG_LV.

Returning to FIG. 1, the first receiver 130 has an input 132 and an output 134. The input 132 of the first receiver 130 is coupled to the first output 124 of the splitter 120 to receive the first signal SIG_LV. In this example, the first receiver 130 includes an inverter including a first transistor 142 and a second transistor 144. In the example in FIG. 1, the first transistor 142 is implemented with a p-type field effect transistor (PFET) and the second transistor 144 is implemented with an n-type field effect transistor (NFET). The inverter is coupled between an upper rail 136 and a lower rail 138. The lower rail 138 provides a supply voltage vssx and the upper rail 136 provides a supply voltage vddix. In one example, the supply voltage vssx is 0 V (e.g., the lower rail 138 is coupled to ground) and the supply voltage vddix is 0.9 V. Thus, in this example, the output 134 of the first receiver 130 swings between 0 V and 0.9 V.

The second receiver 150 has an input 152 and an output 154. The input 152 of the second receiver 150 is coupled to the second output 126 of the splitter 120 to receive the second signal SIG_HV. In this example, the second receiver 150 includes an inverter including a first transistor 162 and a second transistor 164. In the example in FIG. 1, the first transistor 162 is implemented with an NFET and the second transistor 164 is implemented with a PFET. The inverter is coupled between an upper rail 156 and a lower rail 158. The lower rail 158 provides a supply voltage vssix and the upper rail 156 provides a supply voltage vddpx. In one example, the supply voltage vssix is 0.9 V and the supply voltage vddpx is 1.8 V. Thus, in this example, the output 154 of the second receiver 150 swings between 0.9 V and 1.8 V. In certain aspects, the supply voltages vssix and vddix are approximately equal (e.g., 0.9 V).

The logic decision circuit 170 has a first input 172, a second input 174, and an output 176. The first input 172 of the logic decision circuit 170 is coupled to the output 134 of the first receiver 130, the second input 174 of the logic decision circuit 170 is coupled to the output 154 of the second receiver 150, and the output 176 of the logic decision circuit 170 provides the output (labeled "RX_OUT") of the split receiver 110. In certain aspects, the logic decision circuit 170 is configured to output a logic one or logic zero based on both the output 134 of the first receiver 130 and the output 154 of the second receiver 150.

In certain aspects, the logic decision circuit 170 is configured to output a first logic value when the output 134 of the first receiver 130 and the output 154 of the second receiver 150 are both low. In the example discussed above, the first receiver 130 has a low output voltage of 0 V and the second receiver 150 has a low output voltage of 0.9 V. The logic decision circuit 170 is configured to output a second logic value when the output 134 of the first receiver 130 and the output 154 of the second receiver 150 are both high. In the example discussed above, the first receiver 130 has a high output voltage of 0.9 V and the second receiver 150 has a high output voltage of 1.8 V. The first logic value may be zero and the second logic value may be one, or vice versa. In certain aspects, the output 176 of the logic decision circuit 170 may have a low voltage of vssx (e.g., 0 V) and a high voltage of vddix (e.g., 0.9 V). However, it is to be appreciated that the logic decision circuit 170 is not limited to this example. For example, in other aspects, the output 176 of the logic decision circuit 170 may have a low voltage of vssix (e.g., 0.9 V) and a high voltage of vddpx (e.g., 1.8 V). It is also to be appreciated that the logic decision circuit 170 may be coupled to the outputs 134 and 154 of the first receiver 130 and the second receiver 150 via one or more additional components (e.g., one or more buffers, one or more voltage-level shifters, etc.) not shown in FIG. 1.

Exemplary operations of the split receiver 110 will now be described according to certain aspects. When the input signal transitions from low to high 210 (e.g., transitions from 0 V to 1.8 V), the output 134 of the first receiver 130 switches from high to low since the first receiver 130 includes an inverter in this example. The output 154 of the second receiver 150 then switches from high to low when the voltage of the input signal reaches an input high voltage (VIH), an example of which is shown in FIG. 2. In this example, the VIH is the input voltage at which the output 154 of the second receiver 150 switches from high to low, which causes the logic decision circuit 170 to switch to the first logic value discussed above. The VIH may also be referred to as a switch voltage or switch point since the VIH is the input voltage at which the output 154 of the second receiver 150 switches logic states.

In the example in FIG. 1, the VIH is equal to the sum of the supply voltage vssix (e.g., 0.9 V) and the threshold voltage of the first transistor 162. This is because the first transistor 162 turns on when the input voltage is equal to the sum of the supply voltage vssix and the threshold voltage of the first transistor 162. The turning on of the first transistor 162 switches the output 154 of the second receiver 150 low. In this example, the low output voltage of the second receiver 150 is vssix (e.g., 0.9 V).

The threshold voltage of the first transistor 162 may vary due to process, voltage, and temperature (PVT) variations with a worst-case threshold voltage of $v_{thn\_worst}$. In this example, the worst-case VIH of the split receiver 110 is equal to vssix+$v_{thn\_worst}$. A problem with this is that the worst-case VIH may exceed a maximum allowable VIH specified by a standard (e.g., a JEDEC standard), which makes the split receiver 110 unsuitable for a system intended to comply with the standard. For example, for a worst-case threshold voltage of 0.4 V, the worst-case VIH may be 1.3 V (i.e., 0.9 V+0.4 V), which exceeds a maximum allowable VIH of 1.17 V specified by a JEDEC standard for an input voltage swing of 1.8 V. A similar non-compliance issue may also arise when the input signal transitions from high to low 220 (e.g., from 1.8 V to 0 V), as discussed further below.

When the input signal transitions from high to low 220, the output 154 of the second receiver 150 switches from low to high since the second receiver 150 includes an inverter in this example. The output 134 of the first receiver 130 then switches from low to high when the voltage of the input signal falls to an input low voltage (VIL), an example of which is shown in FIG. 2. In this example, the VIL is the input voltage at which the output 134 of the first receiver 130 switches from low to high, which causes the logic decision circuit 170 to switch to the second logic value discussed above.

In the example in FIG. 1, the VIL is equal to the supply voltage vddix (e.g., 0.9 V) minus the threshold voltage of the first transistor 142. This is because the first transistor 142 turns on when the input voltage is equal to the supply voltage vddix minus the threshold voltage of the first transistor 142. The turning on of the first transistor 142 switches the output 134 of the first receiver 130 high. In this example, the high output voltage of the first receiver 130 is vddix (e.g., 0.9 V).

The threshold voltage of the first transistor 142 may vary due to process, voltage, and temperature (PVT) variations with a worst-case threshold voltage of $V_{thp\_worst}$. In this example, the worst-case VIL of the split receiver 110 is equal to vddix−$V_{thp\_worst}$. A problem with this is that the worst-case VIL may be below a minimum allowable VIL specified by a standard (e.g., a JEDEC standard), which makes the split receiver 110 unsuitable for a system intended to comply with the standard. For example, for a worst-case threshold voltage of 0.4 V, the worst-case VIL may be 0.5 V (i.e., 0.9 V-0.4 V), which is below a minimum allowable VIL of 0.63 V specified by a JEDEC standard for an input voltage swing of 1.8 V.

Thus, the split receiver 110 illustrated in FIG. 1 prevents overvoltage damage to the transistors (e.g., the transistors 142, 144, 162, and 164) in the split receiver 110 by splitting the voltage swing of the input signal between the first receiver 130 and the second receiver 150. However, the split receiver 110 may violate the maximum allowable VIH and/or the minimum allowable VIL specified by a standard (e.g., JEDEC standard), which makes the split receiver 110 unsuitable for a system intended to comply with the standard.

To address this, aspects of the present disclosure provide a split receiver with dynamic gate-overdrive voltage boosting to dynamically shift the VIH and/or the VIL (e.g., to comply with a standard). In certain aspects, a gate-overdrive voltage of a transistor in the second receiver 150 is temporarily boosted (i.e., increased) when the input signal transitions from low to high. The gate-overdrive voltage boost lowers the VIH during the transition such that the VIH is below the maximum allowable VIH specified by a standard, and therefore complies with the standard. In certain aspects, the gate-overdrive voltage boosting of the transistor in the second receiver 150 is controlled using the first signal ("SIG_LV) and the second signal ("SIG_HV), which allows the split receiver to operate at a higher frequency and lower power consumption compared with using the output of the logic decision circuit 170 to control the gate-overdrive voltage boosting, as discussed further below. Since the gate-overdrive voltage boosting is not controlled using feedback from the output of the logic decision circuit 170, the potential instability and/or oscillations caused by a feedback loop is eliminated.

In certain aspects, a gate-overdrive voltage of a transistor in the first receiver 130 is temporarily boosted (i.e., increased) when the input signal transitions from high to low. The gate-overdrive voltage boost increases the VIL during the transition such that the VIL is above the minimum allowable VIL specified by a standard, and therefore complies with the standard. In certain aspects, the gate-overdrive voltage boosting of the transistor in the first receiver 130 is controlled using the first signal SIG_LV and the second signal SIG_HV, which allows the split receiver to operate at a higher frequency and lower power consumption compared with using the output of the logic decision circuit 170 to control the gate-overdrive voltage boosting, as discussed further below. Since the gate-overdrive voltage boosting is not controlled using feedback from the output of the logic decision circuit 170, the potential instability and/or oscillations caused by a feedback loop is eliminated. The above aspects and other aspects of the present disclosure are discussed in further detail below.

Figure 3:
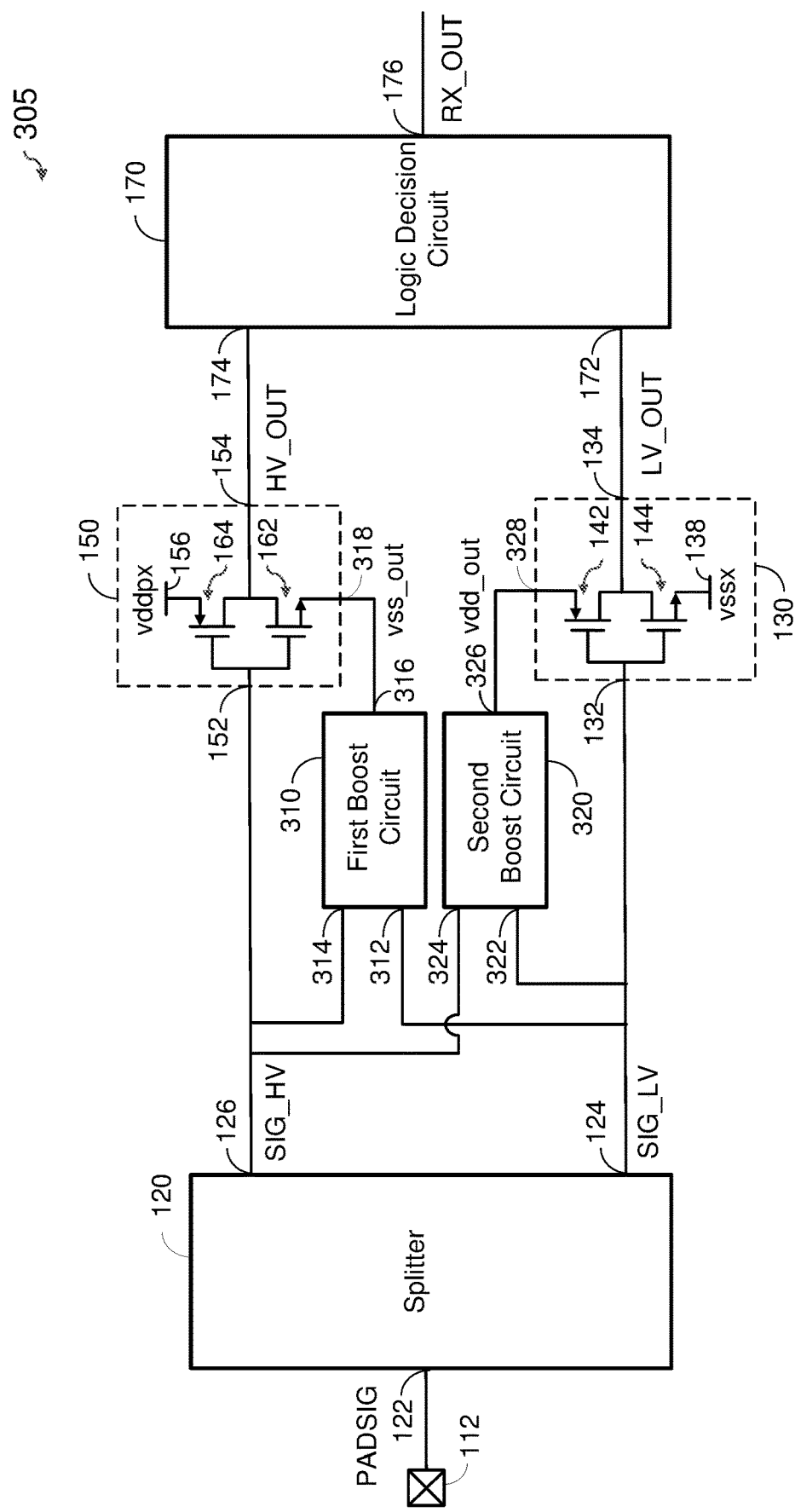
FIG. 3 shows an example of a split receiver with gate-overdrive voltage boosting according to certain aspects of the present disclosure.

FIG. 3 shows an exemplary split receiver 305 with gate-overdrive boosting according to certain aspects of the present disclosure. The split receiver 305 includes the splitter 120, the first receiver 130, the second receiver 150, and the logic decision circuit 170 discussed above. For brevity, a description of the splitter 120, the first receiver 130, the second receiver 150, and the logic decision circuit 170 is not repeated here. The split receiver 305 also includes a first boost circuit 310 and a second boost circuit 320.

The first boost circuit 310 has a first input 312, a second input 314, and an output 316. The first input 312 is coupled to the input 132 of the first receiver 130, and the second input 314 is coupled to the input 152 of the second receiver 150. Thus, the first input 312 receives the first signal SIG_LV and the second input 314 receives the second signal SIG_HV. The output 316 is coupled to a supply terminal 318 of the second receiver 150. In the example in FIG. 3, the supply terminal 318 is coupled to the source of the first transistor 162 in the second receiver 150. As discussed further below, the output 316 of the first boost circuit 310 provides the supply voltage vss_out to the supply terminal 318 of the second receiver 150. Thus, in this example, the source of the first transistor 162 is coupled to the output 316 of the first boost circuit 310 instead of the lower rail 158 shown in FIG. 1.

In certain aspects, the first boost circuit 310 is configured to boost (i.e., increase) a gate-overdrive voltage of the first transistor 162 in the second receiver 150 based on the first signal SIG_LV and the second signal SIG_HV when the input signal transitions from low to high. In these aspects, the gate-overdrive voltage of the first transistor 162 corresponds to the gate-to-source voltage of the first transistor 162. The larger the gate-to-source voltage of the first transistor 162, the larger the gate-overdrive voltage.

In certain aspects, the first boost circuit 310 boosts the gate-overdrive voltage of the first transistor 162 in the second receiver 150 by shifting (i.e., changing or modifying) the supply voltage vss_out. In one example, the first boost circuit 310 may be configured to set the supply voltage vss_out to a voltage of vssix (e.g., 0.9 V) when the gate-overdrive voltage is not boosted, and shift the supply voltage vss_out lower to a voltage of vssix−Δvss to boost the gate-overdrive voltage (i.e., lower the supply voltage vss_out by Δvss). By shifting the supply voltage vss_out lower, the first boost circuit 310 lowers the source voltage of the first transistor 162, which increases (i.e., boosts) the gate-overdrive voltage of the first transistor 162 in the second receiver 150. The gate-overdrive voltage boost shifts the VIH lower, which helps the VIH meet the maximum allowable VIH specified by a standard.

Figure 4:
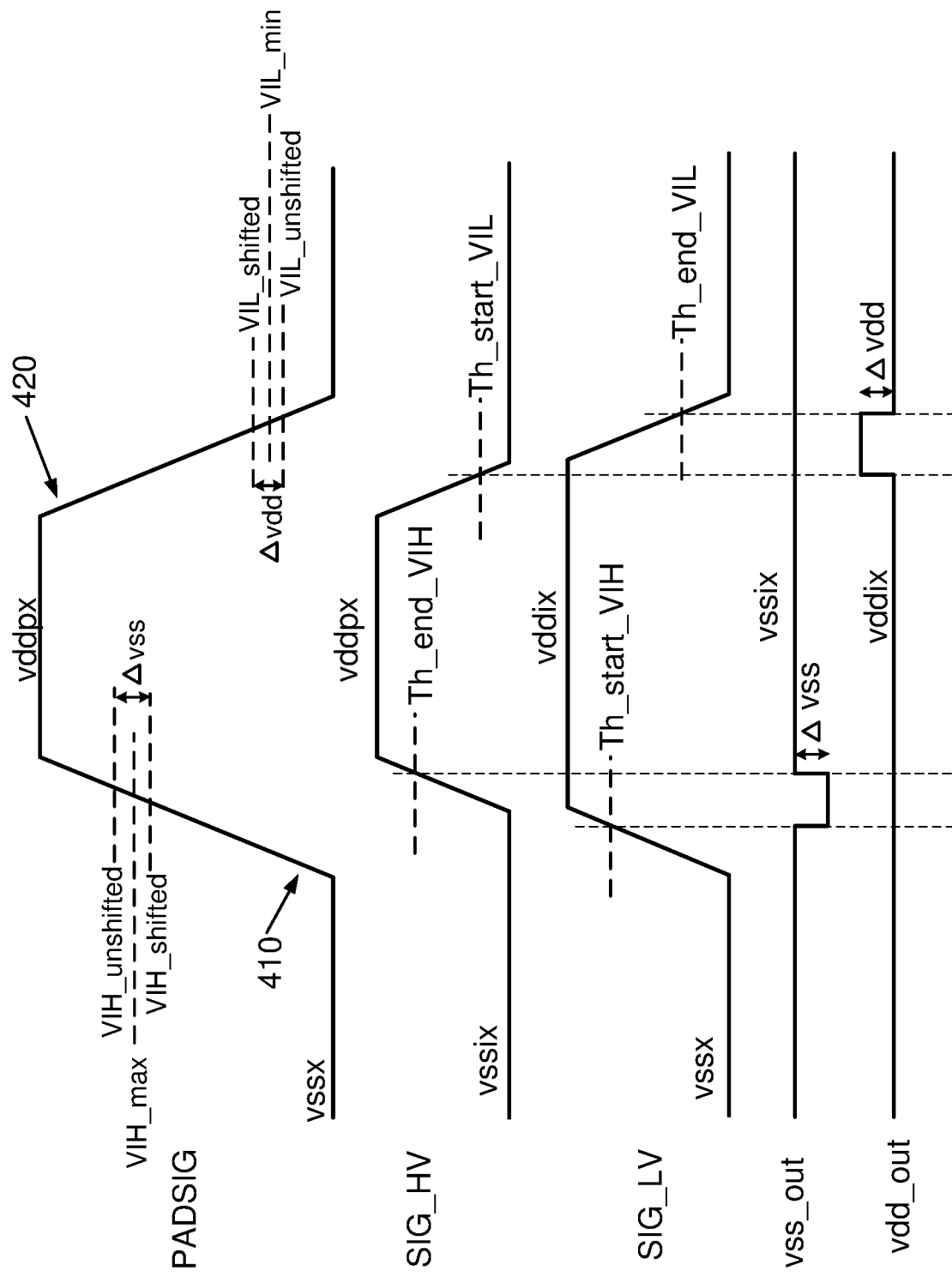
FIG. 4 shows an example of voltage waveforms in the split receiver of FIG. 3 according to certain aspects of the present disclosure.

Exemplary operations of the first boost circuit 310 will now be described according to certain aspects with reference to FIG. 4. FIG. 4 shows an example of the input voltage (labeled "PADSIG"), the first signal SIG_LV, the second signal SIG_HV, and the supply voltage vss_out. FIG. 4 shows an example of a transition 410 of the input signal from low to high. In the example in FIG. 4, the input signal has a low voltage of vssx (e.g., 0 V) and a high voltage of vddpx (e.g., 1.8 V). The transition 410 of the input signal from low to high causes the first signal SIG_LV to transition from low to high, and the second signal SIG_HV to transition from low to high. In the example in FIG. 4, the first signal SIG_LV has a low voltage of vssx (e.g., 0 V) and a high voltage of vddix (e.g., 0.9 V), and the second signal SIG_HV has a low voltage of vssix (e.g., 0.9 V) and a high voltage of vddpx (e.g., 1.8 V).

During the transition of the input signal from low to high, the first boost circuit 310 monitors the voltage of the first signal SIG_LV and the voltage of the second signal SIG_HV. When the voltage of the first signal SIG_LV crosses a first voltage threshold (labeled "Th_start_VIH"), the first boost circuit 310 starts boosting the gate-overdrive of the first transistor 162 in the second receiver 150. As shown in FIG. 4, the first boost circuit 310 starts the gate-overdrive boost by shifting (i.e., changing or modifying) the supply voltage vss_out lower by Δvss. This shifts the VIH lower by Δvss, which helps the VIH meet the maximum allowable VIH (labeled "VIH_max") specified by a standard.

When the voltage of the second signal SIG_HV crosses a second voltage threshold (labeled "Th_end_VIH"), the first boost circuit 310 ends (i.e., stops) boosting the gate-overdrive voltage of the first transistor 162 in the second receiver 150. As shown in FIG. 4, the first boost circuit 310 ends the gate-overdrive boost by returning the supply voltage vss_out to vssix.

In certain aspects, the first threshold Th_start_VIH is set to a voltage below the maximum allowable VIH, and the second threshold Th_end_VIH is set to a voltage above the VIH without gate-overdrive boosting (i.e., unshifted VIH). This helps ensure that the first boost circuit 310 boosts the gate-overdrive voltage when needed to lower the VIH to meet the maximum allowable VIH.

The first boost circuit 310 controls the gate-overdrive voltage boosting of the first transistor 162 in the second receiver 150 based on the first signal SIG_LV (which is input to the first receiver 130) and the second signal SIG_HV (which is input to the second receiver 150). Thus, the first boost circuit 310 controls the gate-overdrive voltage boosting based on the input signals (i.e., the first signal SIG_LV and second signal SIG_HV) to the first receiver 130 and the second receiver 150. This allows the first boost circuit 310 to control the gate-overdrive voltage boost more quickly in response to changes in the voltages of the input signals to the first receiver 130 and the second receiver 150 compared with using the output 134 of the first receiver 130 and/or the output 176 of the logic decision circuit 170 to control the gate-overdrive voltage boost. The faster gate-overdrive voltage control allows the split receiver 305 to operate at faster operating frequencies (e.g., for higher data rates). In addition, using the input signals to the first receiver 130 and the second receiver 150 to control the gate-overdrive voltage boost instead of the output 176 of the logic decision circuit 170 helps avoid potential feedback stability and/or oscillation issues that may arise when feeding back the output of the logic decision circuit 170 to the first boost circuit 310. Also, the DC current drawn by the first boost circuit 310 may be reduced since the first boost circuit 310 provides complete control over the amount of time that the gate-overdrive voltage is boosted by setting the first threshold Th_start_VIH and the second threshold Th_end_VIH accordingly.

The second boost circuit 320 has a first input 322, a second input 324, and an output 326. The first input 322 is coupled to the input 132 of the first receiver 130, and the second input 324 is coupled to the input 152 of the second receiver 150. Thus, the first input 322 receives the first signal SIG_LV and the second input 324 receives the second signal SIG_HV. The output 326 is coupled to a supply terminal 328 of the first receiver 130. In the example in FIG. 3, the supply terminal 328 is coupled to the source of the first transistor 142 in the first receiver 130. As discussed further below, the output 326 of the second boost circuit 320 provides the supply voltage vdd_out to the supply terminal 328 of the first receiver 130. Thus, in this example, the source of the first transistor 142 is coupled to the output 326 of the second boost circuit 320 instead of the upper rail 136 shown in FIG. 1.

In certain aspects, the second boost circuit 320 is configured to boost (i.e., increase) a gate-overdrive voltage of the first transistor 142 in the first receiver 130 based on the first signal SIG_LV and the second signal SIG_HV when the input signal transitions from high to low. In these aspects, the gate-overdrive voltage of the first transistor 142 corresponds to the source-to-gate voltage of the first transistor 142. The larger the source-to-gate voltage of the first transistor 142, the larger the gate-overdrive voltage.

In certain aspects, the second boost circuit 320 boosts the gate-overdrive voltage of the first transistor 142 by shifting (i.e., changing or modifying) the supply voltage vdd_out. In one example, the second boost circuit 320 may be configured to set the supply voltage vdd_out to a voltage of vddix (e.g., 0.9 V) when the gate-overdrive voltage is not boosted, and shift the supply voltage vdd_out higher to a voltage of vddix+Δvdd to boost the gate-overdrive voltage (i.e., raise the supply voltage vdd_out by Δvdd). By shifting the supply voltage vdd_out higher, the second boost circuit 320 raises the source voltage of the first transistor 142, which increases (i.e., boosts) the gate-overdrive voltage of the first transistor 142. The gate-overdrive voltage boost shifts the VIL higher, which helps the VIL meet the minimum allowable VIL specified by a standard.

Exemplary operations of the second boost circuit 320 will now be described according to certain aspects with reference to FIG. 4. FIG. 4 shows an example of a transition 420 of the input signal from high to low. The transition 420 of the input signal from high to low causes the second signal SIG_HV to transition from high to low, and the first signal SIG_LV to transition from high to low.

During the transition of the input signal from high to low, the second boost circuit 320 monitors the voltage of the first signal SIG_LV and the voltage of the second signal SIG_HV. When the voltage of the second signal SIG_HV crosses a first voltage threshold (labeled "Th_start_VIL"), the second boost circuit 320 starts boosting the gate-overdrive of the first transistor 142 in the first receiver 130. As shown in FIG. 4, the second boost circuit 320 starts the gate-overdrive boost by shifting (i.e., changing or modifying) the supply voltage vdd_out higher by Δvdd. This shifts the VIL high by Δvdd, which helps the VIL meet the minimum allowable VIL (labeled "VIL_min") specified by a standard.

When the voltage of the first signal SIG_LV crosses a second voltage threshold (labeled "Th_end_VIL"), the second boost circuit 320 ends (i.e., stops) boosting the gate-overdrive voltage of the first transistor 142 in the first receiver 130. As shown in FIG. 4, the second boost circuit 320 ends the gate-overdrive boost by returning the supply voltage vdd_out to vddix.

In certain aspects, the first threshold Th_start_VIL is set to a voltage above the minimum allowable VIL, and the second threshold Th_end_VIL is set to a voltage below the VIL without gate-overdrive boosting (i.e., unshifted VIL). This helps ensure that the second boost circuit 320 boosts the gate-overdrive voltage when needed to raise the VIL to meet the minimum allowable VIL.

The second boost circuit 320 controls the gate-overdrive voltage boosting of the first transistor 142 in the first receiver 130 based on the first signal SIG_LV (which is input to the first receiver 130) and the second signal SIG_HV (which is input to the second receiver 150). Thus, the second boost circuit 320 controls the gate-overdrive voltage boosting based on the input signals (i.e., the first signal SIG_LV and second signal SIG_HV) to the first receiver 130 and the second receiver 150. This allows the second boost circuit 320 to control the gate-overdrive voltage quickly in response to changes in the voltages of the input signals to the first receiver 130 and the second receiver 150, allowing the split receiver 305 to operate at faster operating frequencies (e.g., for higher data rates).

Figure 5:
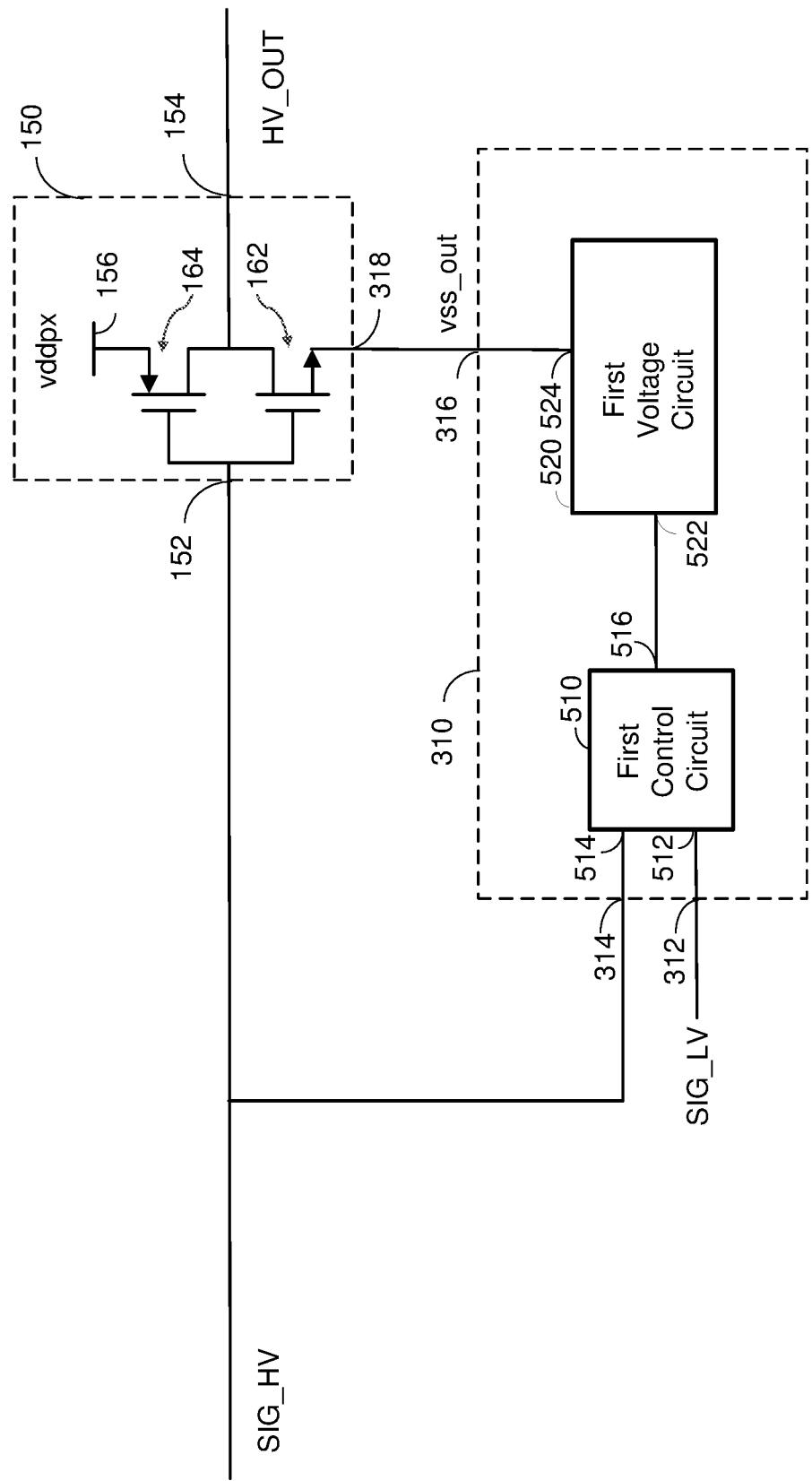
FIG. 5 shows an exemplary implementation of a first boost circuit according to certain aspects of the present disclosure.

FIG. 5 shows an exemplary implementation of the first boost circuit 310 according to certain aspects. In this example, the first boost circuit 310 includes a first control circuit 510 and a first voltage circuit 520. The first control circuit 510 has a first input 512, a second input 514, and an output 516. The first input 512 of the first control circuit 510 is coupled to the first input 312 to receive the first signal SIG_LV, and the second input 514 of the first control circuit 510 is coupled to the second input 314 to receive the second signal SIG_HV.

The first voltage circuit 520 has a control input 522 coupled to the output 516 of the first control circuit 510, and an output 524 coupled to the supply terminal 318 of the second receiver 150. The first voltage circuit 520 is configured to output the supply voltage vss_out at the output 524. In certain aspects, the first voltage circuit 520 is configured to receive a shift-control signal from the first control circuit 510 at the control input 522. When the shift-control signal is disabled, the first voltage circuit 520 is configured to set the supply voltage vss_out to the voltage vssix (e.g., 0.9 V). When the shift-control circuit is enabled, the first voltage circuit 520 is configured to shift the supply voltage vss_out lower by a voltage shift of Δvss. In this case, the supply voltage vss_out is equal to vssix−Δvss. As discussed above, shifting the supply voltage vss_out lower boosts the gate-overdrive voltage of the first transistor 162 in the second receiver 150.

In one example, the shift-control signal may have a first logic value when disabled and a second logic value when enabled. The first logic value may be zero and the second logic value may be one, or vice versa. In this example, the first voltage circuit 520 is configured to set the supply voltage vss_out to vssix when the shift-control has the first logic value, and to shift the supply voltage vss_out lower by Δvss when the shift-control signal has the second logic value. However, it is to be appreciated that the present disclosure is not limited to this example.

When the input signal transitions from low to high, the first control circuit 510 may cause the first voltage circuit 520 to shift the supply voltage vss_out lower by Δvss (e.g., enable the shift-control signal) between the time that the first signal SIG_LV crosses the first threshold Th_start_VIH and the time that the second signal SIG_HV crosses the second threshold Th_end_VIH. In this example, the first control circuit 510 starts the gate-overdrive boost (e.g., enables the shift-control signal) when the first signal SIG_LV crosses the first threshold Th_start_VIH and ends the gate-overdrive boost (e.g., disables the shift-control signal) when the second signal SIG_HV crosses the second threshold Th_end_VIH. The first control circuit 510 may cause the first voltage circuit 520 to set the supply voltage vss_out to vssix (e.g., disable the shift-control signal) before the first signal SIG_LV reaches the first threshold Th_start_VIH and after the second signal SIG_HV rises above the second threshold TH_end_VIH during a transition of the input signal from low to high. The first control circuit 510 may cause the first voltage circuit 520 to set the supply voltage vss_out to vssix (e.g., disable the shift-control signal) when the input signal is not transitioning or when the input signal transitions from high to low.

Figure 6:
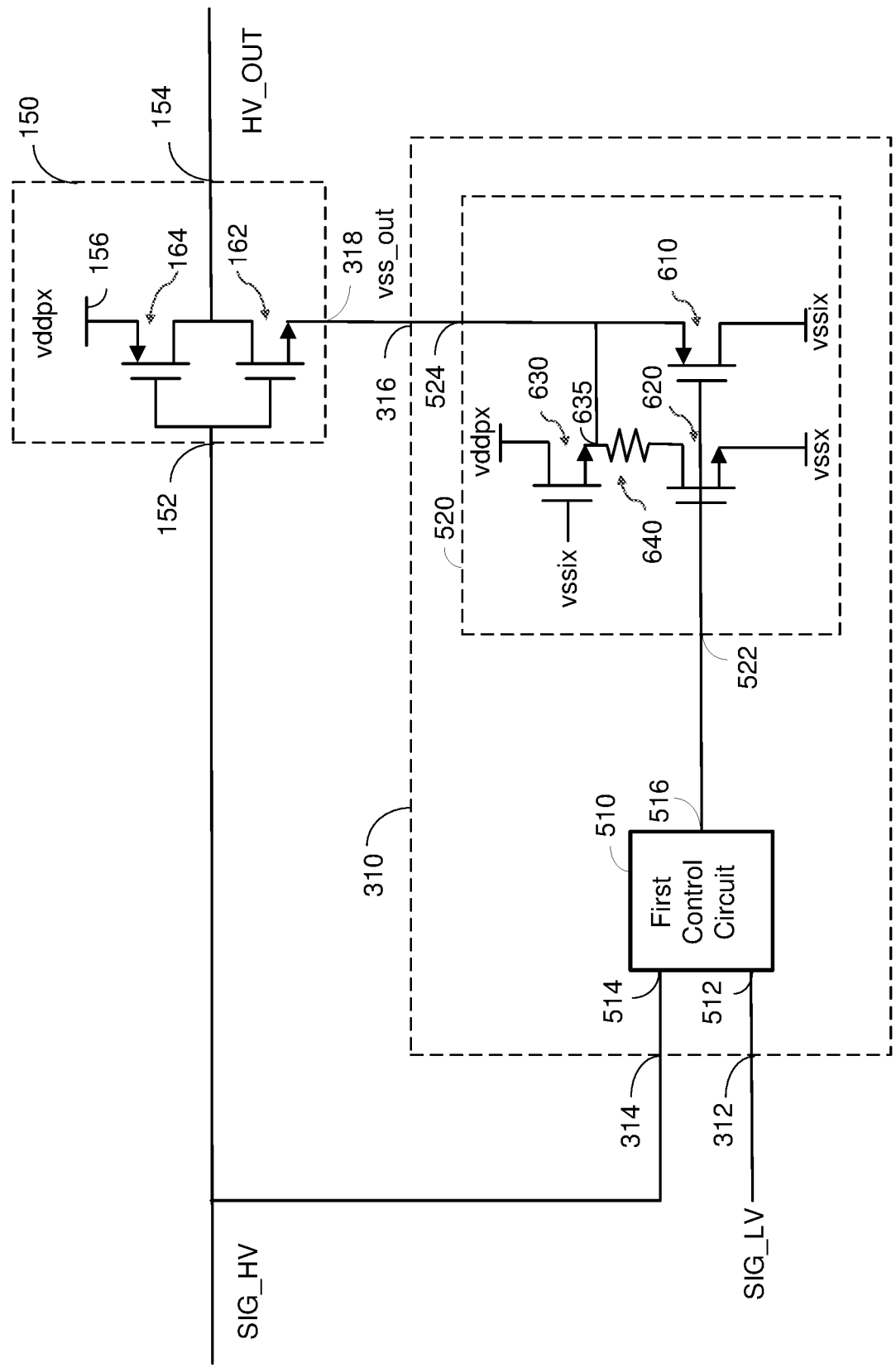
FIG. 6 shows an exemplary implementation of a first voltage circuit according to certain aspects of the present disclosure.

FIG. 6 shows an exemplary implementation of the first voltage circuit 520 according to certain aspects. In this example, the first voltage circuit 520 includes a first transistor 610, a second transistor 620, a third transistor 630, and a resistor 640. In the example in FIG. 6, the first transistor 610 is implemented with a PFET and each of the second transistor 620 and the third transistor 630 is implemented with a respective NFET. The source of the first transistor 610 is coupled to the output 524, the gate of the first transistor 610 is coupled to the output 516 of the first control circuit 510, and the drain of the first transistor 610 is coupled to the voltage vssix (e.g., 0.9 V). The source of the second transistor 620 is coupled to the voltage vssx (e.g., 0 V), and the gate of the second transistor 620 is coupled to the output 516 of the first control circuit 510. The drain of the third transistor 630 is coupled to the voltage vddpx (e.g., 1.8 V), and the gate of the third transistor 630 is biased by the voltage vssix. The resistor 640 is coupled between the source of the third transistor 630 and the drain of the second transistor 620. Also, the output 524 is coupled to a node 635 located between the source of the third transistor 630 and the resistor 640.

In this example, the first control circuit 510 sets the supply voltage vss_out to vssix by turning on the first transistor 610 and turning off the second transistor 620. For example, the first control circuit 510 may set the shift-control signal low (e.g., vssx) to turn on the first transistor 610 since the first transistor 610 is implemented with a PFET in this example. In this example, the first control circuit 510 outputs a logic zero to disable the shift-control signal (e.g., the first logic value discussed above is zero). In this case, the first transistor 610 couples the output 524 of the first voltage circuit 520 to the voltage vssix through the first transistor 610.

The first control circuit 510 causes the first voltage circuit 520 to shift the supply voltage vss_out lower by turning on the second transistor 620 and turning off the first transistor 610. For example, the first control circuit 510 may set the shift-control signal high (e.g., vddpx) to turn on the second transistor 620 since the second transistor 620 is implemented with a NFET in this example. In this example, the first control circuit 510 outputs a logic one to enable the shift-control signal (e.g., the second logic value discussed above is one). When the second transistor 620 is turned on, the second transistor 620 pulls the supply voltage vss_out below the voltage vssix through the resistor 640, which shifts the supply voltage vss_out lower. The voltage shift Δvss depends on the voltage drop across the resistor 640, which, in turn, depends on the resistance of the resistor 640. Thus, the voltage shift Δvss may be set to a desired value, for example, by choosing the resistance of the resistor 640 accordingly.

Figure 7:
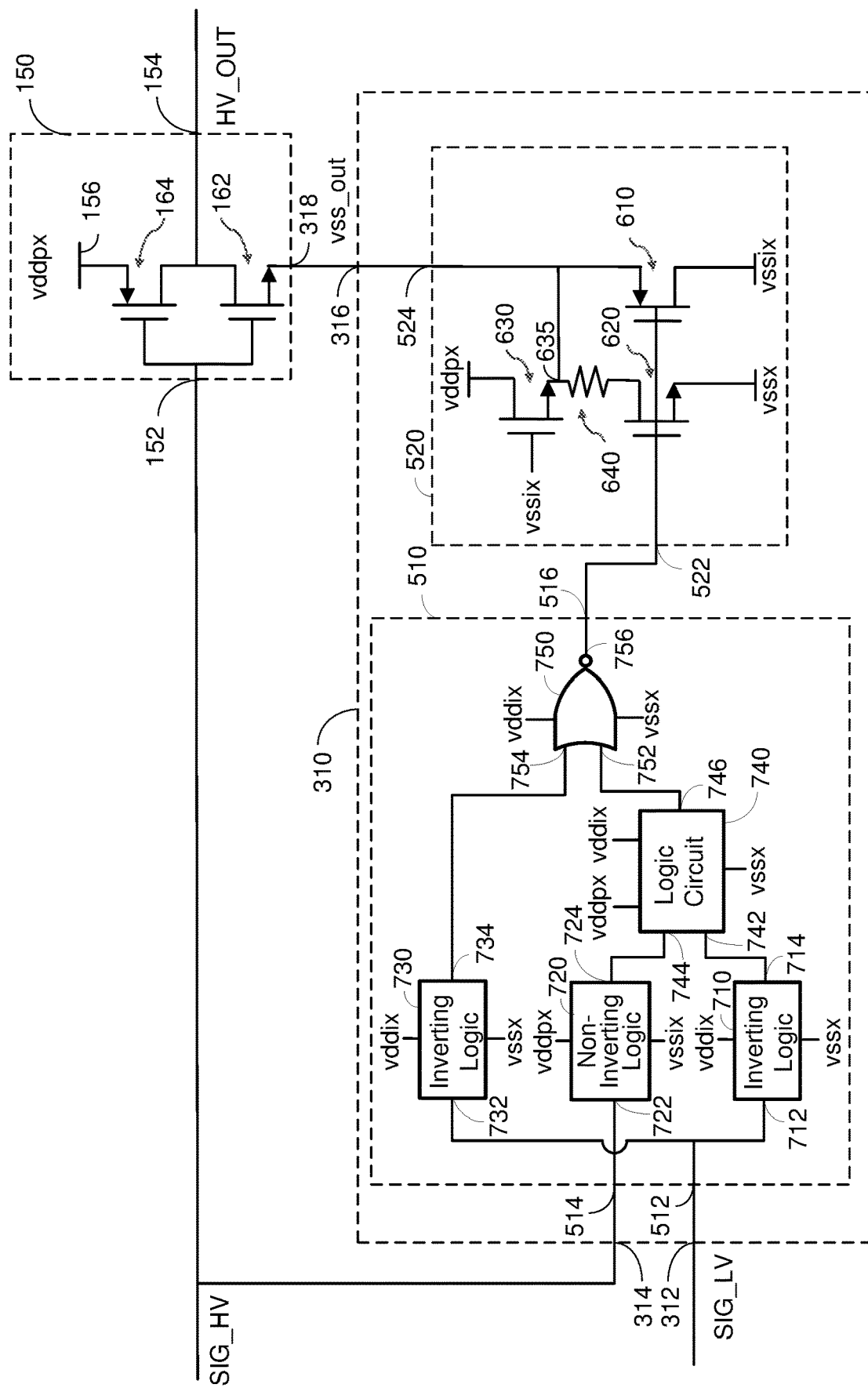
FIG. 7 shows an exemplary implementation of a first control circuit according to certain aspects of the present disclosure.

FIG. 7 shows an exemplary implementation of the first control circuit 510 according to certain aspects of the present disclosure. In this example, the first control circuit 510 includes first inverting logic 710, second inverting logic 730, non-inverting logic 720, a logic circuit 740, and a NOR gate 750.

The first inverting logic 710 has an input 712 and an output 714. The input 712 is coupled to the first input 512 of the first control circuit 510, and therefore receives the first signal SIG_LV. The first inverting logic 710 is coupled between supply voltages vddix and vssx. Thus, the output 714 swings between vssx and vddix with a low voltage of vssx and a high voltage of vddix. The first inverting logic 710 may be implemented with an inverter. In operation, the first inverting logic 710 is configured to switch the output 714 from high to low when the voltage of the first signal SIG_LV at the input 712 rises above a trigger voltage of the first inverting logic 710. For the example where the first inverting logic 710 is implemented with a complementary inverter including a PFET and an NFET, the trigger voltage may be set, for example, by setting a P/N ratio of the first inverting logic 710, in which P is the channel width of the PFET and N is the channel width of the NFET.

The second inverting logic 730 has an input 732 and an output 734. The input 732 is coupled to the first input 512 of the first control circuit 510, and therefore receives the first signal SIG_LV. The second inverting logic 730 is coupled between supply voltages vddix and vssx. Thus, the output 734 swings between vssx and vddix with a low voltage of vssx and a high voltage of vddix. The second inverting logic 730 may be implemented with an inverter (e.g., a complementary inverter including a PFET and an NFET). In operation, the second inverting logic 730 is configured to switch the output 734 from high to low when the voltage of the first signal SIG_LV at the input 732 rises above a trigger voltage of the second inverting logic 730. In certain aspects, the first inverting logic 710 and the second inverting logic 730 may have the same or substantially the same structure and/or approximately the same trigger voltage.

The non-inverting logic 720 has an input 722 and an output 724. The input 722 is coupled to the second input 514 of the first control circuit 510, and therefore receives the second signal SIG_HV. The non-inverting logic 720 is coupled between supply voltages vddpx and vssix. Thus, the output 724 swings between vssix and vddpx with a low voltage of vssix and a high voltage of vddpx. In operation, the non-inverting logic 720 is configured to switch the output 724 from low to high when the voltage of the second signal SIG_LV at the input 722 rises above a trigger voltage of the non-inverting logic 720.

The logic circuit 740 has a first input 742, a second input 744, and an output 746. The first input 742 is coupled to the output 714 of the first inverting logic 710, and the second input 744 is coupled to the output 724 of the non-inverting logic 720. In this example, the first input 742 swings between vssx and vddix since the output 714 of the first inverting logic 710 swings between vssx and vddix, and the second input 744 swings between vssix and vddpx since the output 724 of the non-inverting logic 720 swings between vssix and vddpx. The output 746 of the logic circuit 740 swings between vssx and vddix. The logic circuit 740 is configured to perform logic operations to generate one of the input signals for the NOR gate 750, as discussed further below. The logic circuit 740 may also perform voltage-level shifting to shift the voltage from the output 724 of the non-inverting logic 720 from between vssix and vddpx to between vssx and vddix.

The NOR gate 750 has a first input 752, a second input 754, and an output 756. The first input 752 is coupled to the output 746 of the logic circuit 740, and the second input 754 is coupled to the output 734 of the second inverting logic 730. The output 756 is coupled to the output 516 of the first control circuit 510, and hence provides the shift-control signal of the first control circuit 510. The NOR gate 750 is coupled between the supply voltages vssx and vddix, and hence the output 756 of the NOR gate 750 swings between vssx and vddix with a low voltage of vssx and a high voltage of vddix. In the example in FIG. 7, the output 756 of the NOR gate 750 is coupled to the gates of the first transistor 610 and the second transistor 620 of the first voltage circuit 520.

When the input signal is low, the output 714 of the first inverting logic 710 and the output 734 of the second inverting logic 730 are both high, and the output 724 of the non-inverting logic 720 is low. The logic circuit 740 may be configured to make the output 746 high (i.e., logic one) when the output 714 of the first inverting logic 710 is high and the output 724 of the non-inverting logic 720 is low. In this case, the output 756 of the NOR gate 750 is low, which turns on the first transistor 610 and turns off the second transistor 620.

When the input signal transitions from low to high, the output 714 of the first inverting logic 710 transitions from high to low when the first signal SIG_LV crosses the trigger voltage of the first inverting logic 710, and the output 734 of the second inverting logic 730 transitions from high to low when the first signal SIG_LV crosses the trigger voltage of the second inverting logic 730. The logic circuit 740 may be configured to make the output low (i.e., logic zero) when the output 714 of the first inverting logic 710 transitions from high to low and the output 724 of the non-inverting logic 720 is low. In this case, both inputs 752 and 754 of the NOR gate 750 become low (i.e., logic zero), which causes the output 756 of the NOR gate 750 to transition from low to high. As a result, the NOR gate 750 turns on the second transistor 620 and turns off the first transistor 610, which starts gate-overdrive boosting of the first transistor 162 in the second receiver 150. Thus, gate-overdrive boosting starts when the first signal SIG_LV crosses the trigger voltages of the first inverting logic 710 and the second inverting logic 730. Assuming the first inverting logic 710 and the second inverting logic 730 have approximately the same trigger voltage, the trigger voltage of the first inverting logic 710 and the second inverting logic 730 sets the first threshold Th_start_VIH discussed above with reference to FIG. 4.

As the voltage of the input signal continues to rise during the transition from low to high, the second signal SIG_HV eventually crosses the trigger voltage of the non-inverting logic 720 causing the output 724 of the non-inverting logic 720 to transition from low to high. The logic circuit 740 may be configured to make the output 746 high (i.e., logic one) when the output 714 of the first inverting logic 710 is low and the output 724 of the non-inverting logic 720 transitions from low to high. In this case, the first input 752 of the NOR ate 750 becomes high which causes the output 756 of the NOR gate 750 to transition from high to low. As a result, the NOR gate 750 turns off the second transistor 620 and turns on the first transistor 610, which ends gate-overdrive boosting of the first transistor 162 in the second receiver 150. Thus, gate-overdrive boosting ends when the second signal SIG_LH crosses the trigger voltage of the non-inverting logic 720. In this example, the trigger voltage of the non-inverting logic 720 sets the second threshold Th_end_VIH. Note that the trigger voltage of the non-inverting logic 720 is between vssix and vddpx in this example since the non-inverting logic 720 is coupled between vssix and vddpx.

It is to be appreciated that the first control circuit 510 is not limited to the example shown in FIG. 7, and that the first control circuit 510 may be implemented using various combinations of logic circuits to perform the functions discussed above with reference to FIG. 4. In other words, FIG. 7 shows one example of the many different ways the first control circuit 510 may be implemented.

Figure 8:
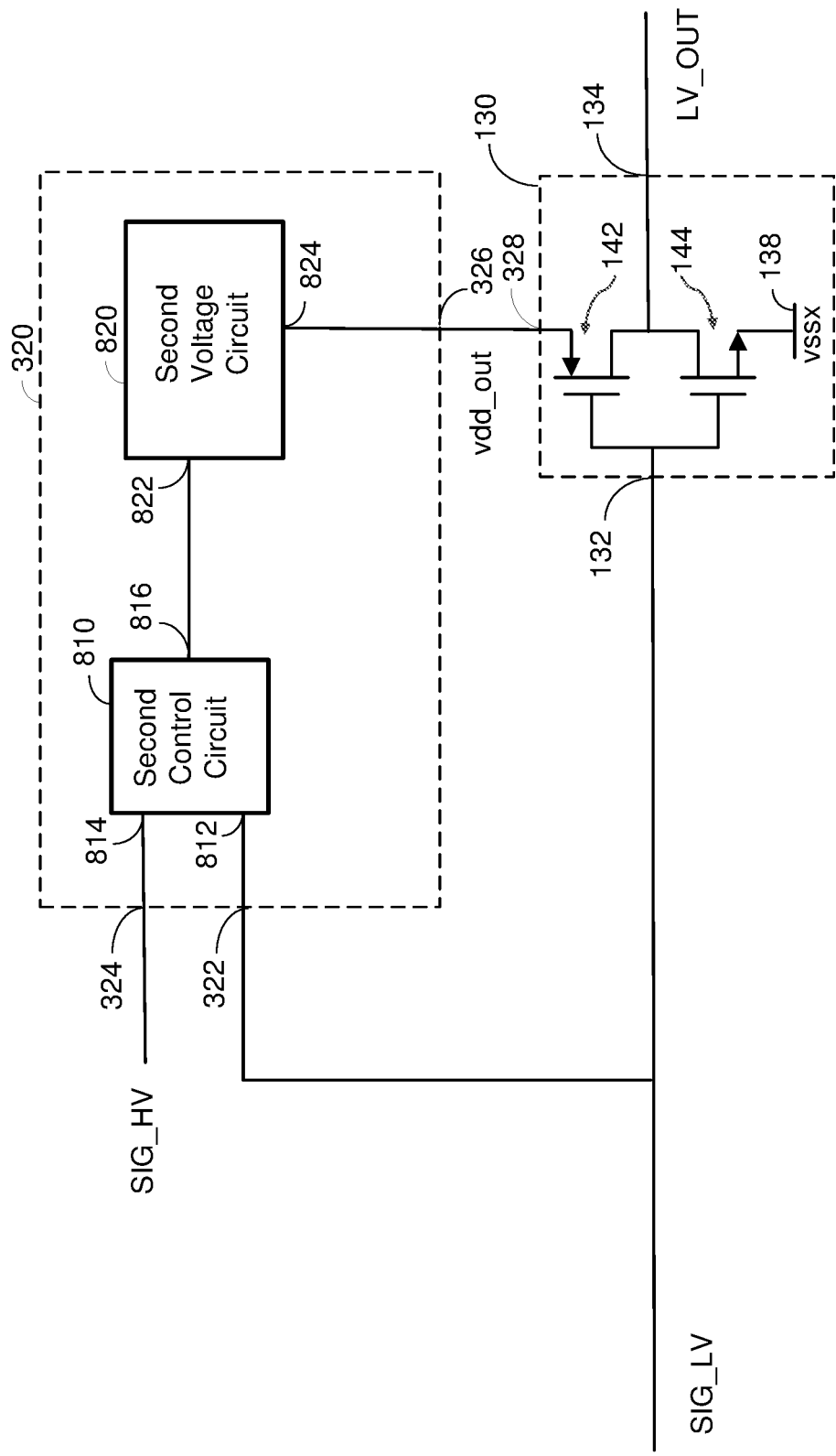
FIG. 8 shows an exemplary implementation of a second boost circuit according to certain aspects of the present disclosure.

FIG. 8 shows an exemplary implementation of the second boost circuit 320 according to certain aspects. In this example, the second boost circuit 320 includes a second control circuit 810 and a second voltage circuit 820. The second control circuit 810 has a first input 812, a second input 814, and an output 816. The first input 812 of the second control circuit 810 is coupled to the first input 322 to receive the first signal SIG_LV, and the second input 814 of the second control circuit 810 is coupled to the second input 324 to receive the second signal SIG_HV.

The second voltage circuit 820 has a control input 822 coupled to the output 816 of the second control circuit 810, and an output 824 coupled to the supply terminal 328 of the first receiver 130. The second voltage circuit 820 is configured to output the supply voltage vdd_out at the output 824. In certain aspects, the second voltage circuit 820 is configured to receive a shift-control signal from the second control circuit 810 at the control input 822. When the shift-control signal is disabled, the second voltage circuit 820 is configured to set the supply voltage vdd_out to the voltage vddix (e.g., 0.9 V). When the shift-control circuit is enabled, the second voltage circuit 820 is configured to shift the supply voltage vdd_out higher by a voltage shift of Δvdd. In this case, the supply voltage vdd_out is equal to vddix+Δvdd. As discussed above, shifting the supply voltage vdd_out higher boosts the gate-overdrive voltage of the first transistor 142 in the first receiver 130.

In one example, the shift-control signal may have a first logic value when disabled and a second logic value when enabled. The first logic value may be zero and the second logic value may be one, or vice versa. In this example, the second voltage circuit 820 is configured to set the supply voltage vdd_out to vddix when the shift-control has the first logic value, and to shift the supply voltage vdd_out higher by Δvdd when the shift-control signal has the second logic value. However, it is to be appreciated that the present disclosure is not limited to this example.

When the input signal transitions from high to low, the second control circuit 810 may cause the second voltage circuit 820 to shift the supply voltage vdd_out higher by Δvdd (e.g., enable the shift-control signal) between the time that the second signal SIG_HV crosses the first threshold Th_start_VIL and the time that the first signal SIG_LV crosses the second threshold Th_end_VIL. In this example, the second control circuit 810 starts the gate-overdrive boost (e.g., enables the shift-control signal) when the second signal SIG_HV crosses the first threshold Th_start_VIL and ends the gate-overdrive boost (e.g., disables the shift-control signal) when the first signal SIG_LV crosses the second threshold Th_end_VIL. The second control circuit 810 may cause the second voltage circuit 820 to set the supply voltage vdd_out to vddix (e.g., disable the shift-control signal) before the second signal SIG_HV reaches the first threshold Th_start_VIL and after the first signal SIG_LV falls below the second threshold TH_end_VIL during a transition of the input signal from high to low. The second control circuit 810 may cause the second voltage circuit 820 to set the supply voltage vdd_out to vddix (e.g., disable the shift-control signal) when the input signal is not transitioning or transitioning from low to high.

Figure 9:
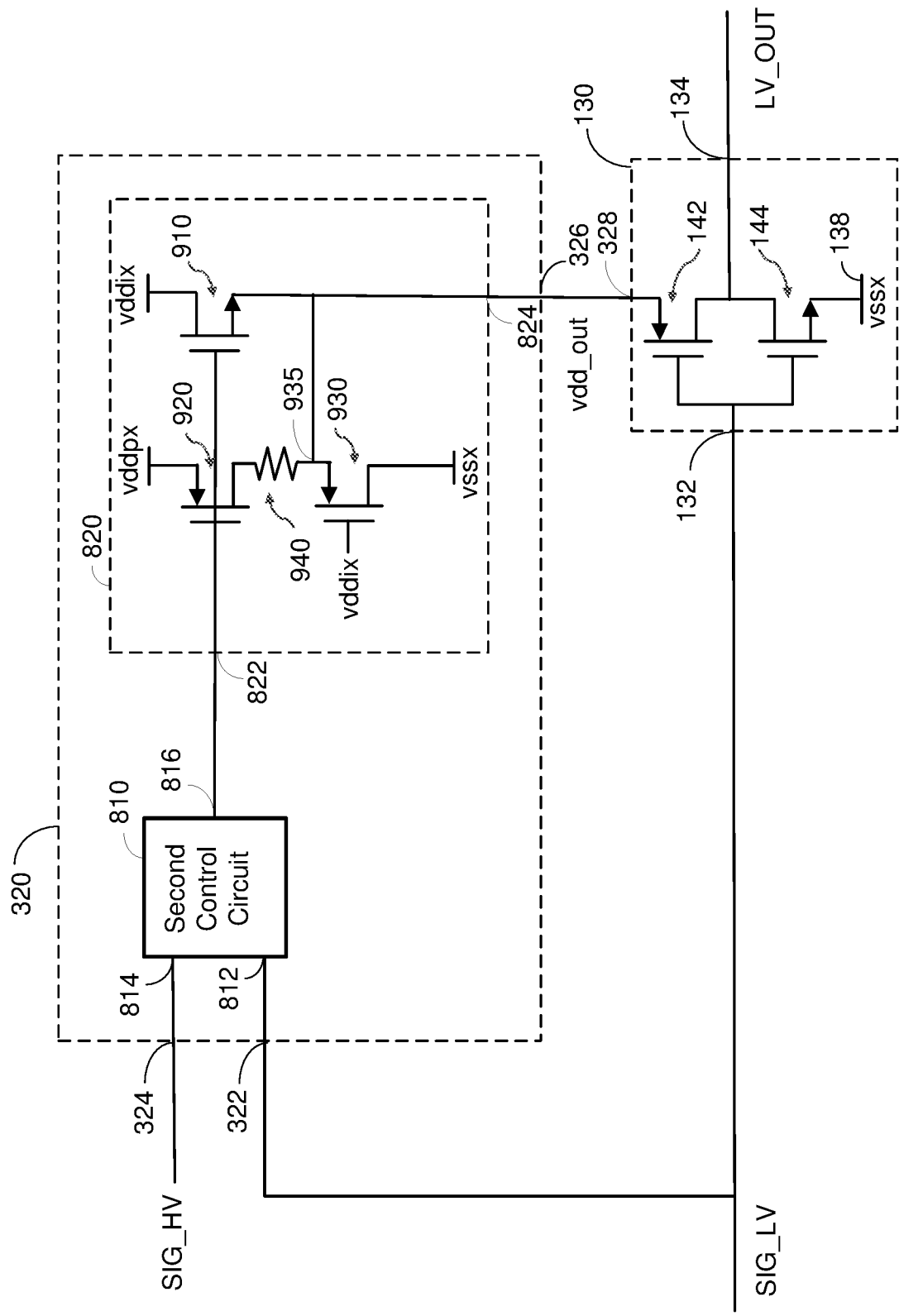
FIG. 9 shows an exemplary implementation of a second voltage circuit according to certain aspects of the present disclosure.

FIG. 9 shows an exemplary implementation of the second voltage circuit 820 according to certain aspects. In this example, the second voltage circuit 820 includes a first transistor 910, a second transistor 920, a third transistor 930, and a resistor 940. In the example in FIG. 9, the first transistor 910 is implemented with a NFET and each of the second transistor 920 and the third transistor 930 is implemented with a respective PFET. The source of the first transistor 910 is coupled to the output 824, the gate of the first transistor 910 is coupled to the output 816 of the second control circuit 810, and the drain of the first transistor 910 is coupled to the voltage vddix (e.g., 0.9 V). The source of the second transistor 920 is coupled to the voltage vddpx (e.g., 1.8 V), and the gate of the second transistor 920 is coupled to the output 816 of the second control circuit 810.

The drain of the third transistor 930 is coupled to the voltage vssx (e.g., 0 V), and the gate of the third transistor 930 is biased by the voltage vddix. The resistor 940 is coupled between the source of the third transistor 930 and the drain of the second transistor 920. Also, the output 824 is coupled to a node 935 located between the source of the third transistor 930 and the resistor 940.

In this example, the second control circuit 810 sets the supply voltage vdd_out to vddix by turning on the first transistor 910 and turning off the second transistor 920. For example, the second control circuit 810 may set the shift-control signal high (e.g., vddpx) to turn on the first transistor 910 since the first transistor 910 is implemented with an NFET in this example. In this case, the first transistor 910 couples the output 824 of the second voltage circuit 820 to the voltage vddix through the first transistor 910.

The second control circuit 810 causes the second voltage circuit 820 to shift the supply voltage vdd_out higher by turning on the second transistor 920 and turning off the first transistor 910. For example, the second control circuit 810 may set the shift-control low (e.g., vssix) to turn on the second transistor 920 since the second transistor 920 is implemented with a PFET in this example. When the second transistor 920 is turned on, the second transistor 920 pulls the supply voltage vdd_out above the voltage vddix through the resistor 940, which shifts the supply voltage vdd_out higher. The voltage shift Δvdd depends on the voltage drop across the resistor 940, which, in turn, depends on the resistance of the resistor 940. Therefore, the voltage shift Δvdd may be set to a desired value, for example, by choosing the resistance of the resistor 940 accordingly.

One skilled in the art will appreciate that the second control circuit 810 may be implemented using various combinations of logic circuits configured to perform the functions of the second control circuit 810 discussed above with reference to FIG. 4.

Figure 10:
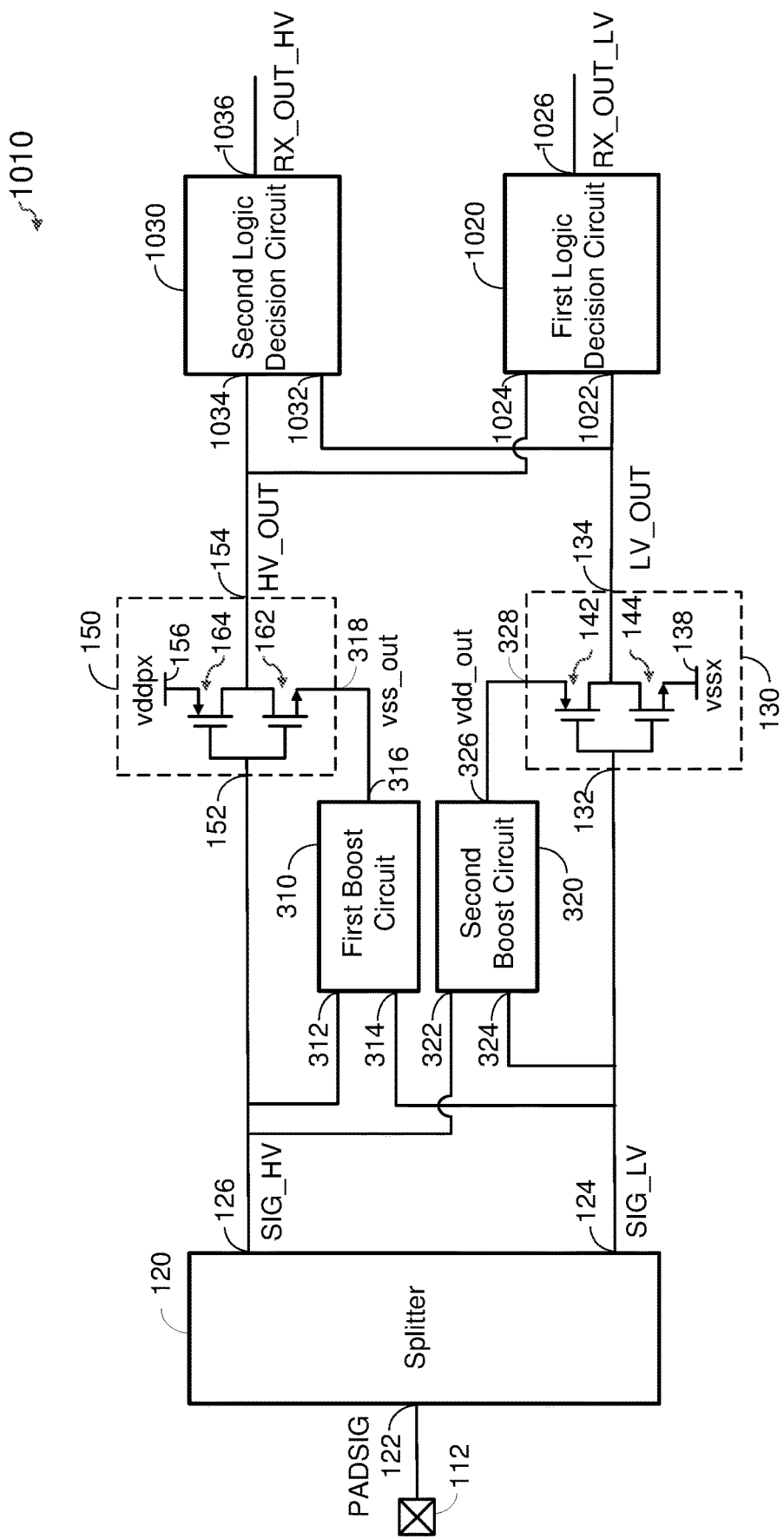
FIG. 10 shows an example of a split receiver including a first logic decision circuit and a second logic decision circuit according to certain aspects of the present disclosure.

It is to be appreciated that the split receiver 305 may include more than one logic decision circuit 170. In this regard, FIG. 10 shows an example of a split receiver 1010 including the splitter 120, the first receiver 130, the second receiver 150, the first boost circuit 310, and the second boost circuit 320 discussed above. The split receiver 1010 also includes a first logic decision circuit 1020 and a second logic decision circuit 1030. In certain aspects, the first logic decision circuit 1020 and the second logic decision circuit 1030 output logic values in different voltage domains to subsequent circuits (not shown).

The first logic decision circuit 1020 has a first input 1022, a second input 1024, and an output 1026. The first input 1022 of the first logic decision circuit 1020 is coupled to the output 134 of the first receiver 130, the second input 1024 of the first logic decision circuit 1020 is coupled to the output 154 of the second receiver 150, and the output 1026 of the first logic decision circuit 1020 provides a first output (labeled "RX_OUT_LV") of the split receiver 1010. In certain aspects, the first logic decision circuit 1020 is configured to output a logic one or logic zero based on both the output 134 of the first receiver 130 and the output 154 of the second receiver 150.

In certain aspects, the first logic decision circuit 1020 is configured to output a first logic value when the output 134 of the first receiver 130 and the output 154 of the second receiver 150 are both low, and output a second logic value when the output 134 of the first receiver 130 and the output 154 of the second receiver 150 are both high. The first logic value may be zero and the second logic value may be one, or vice versa. In certain aspects, the output 1026 of the first logic decision circuit 1020 may have a low voltage of vssx (e.g., 0 V) and a high voltage of vddix (e.g., 0.9 V). However, it is to be appreciated that present disclosure is not limited to this example.

The second logic decision circuit 1030 has a first input 1032, a second input 1034, and an output 1036. The first input 1032 of the second logic decision circuit 1030 is coupled to the output 134 of the first receiver 130, the second input 1034 of the second logic decision circuit 1030 is coupled to the output 154 of the second receiver 150, and the output 1036 of the second logic decision circuit 1030 provides a second output (labeled "RX_OUT_HV") of the split receiver 1010. In certain aspects, the second logic decision circuit 1030 is configured to output a logic one or logic zero based on both the output 134 of the first receiver 130 and the output 154 of the second receiver 150.

In certain aspects, the second logic decision circuit 1030 is configured to output a first logic value when the output 134 of the first receiver 130 and the output 154 of the second receiver 150 are both low, and output a second logic value when the output 134 of the first receiver 130 and the output 154 of the second receiver 150 are both high. The first logic value may be zero and the second logic value may be one, or vice versa. In certain aspects, the output 1036 of the second logic decision circuit 1030 may have a low voltage of vssix (e.g., 0.9 V) and a high voltage of vddpx (e.g., 1.8 V). However, it is to be appreciated that present disclosure is not limited to this example.

Thus, in this example, the first logic decision circuit 1020 and the second logic decision circuit 1030 may output signals in different voltage domains, in which the output 1026 of the first logic decision circuit 1020 swings between vssx and vddix in a first voltage domain, and the output 1036 of the second logic decision circuit 1030 swings between vssix and vddpx in a second voltage domain. This may be done, for example, when the system including the split receiver 1010 includes circuits operating in the first voltage domain and circuits operating in the second voltage domain. In this example, the circuits operating in the first voltage domain may be coupled to the output 1026 of the first logic decision circuit 1020, and the circuits operating in the second voltage domain may be coupled to the output 1036 of the second logic decision circuit 1030.

It is to be appreciated that, in some implementations, one of the first boost circuit 310 and the second boost circuit 320 may be omitted from the split receiver 305 or 1010. For example, for cases in which meeting a minimum allowable VIL is not an issue, the split receiver 305 or 1010 may include the first boost circuit 310 with the second boost circuit 320 omitted. For cases in which meeting a maximum allowable VIH is not an issue, the split receiver 305 or 1010 may include the second boost circuit 320 with the first boost circuit 310 omitted.

Figure 11:
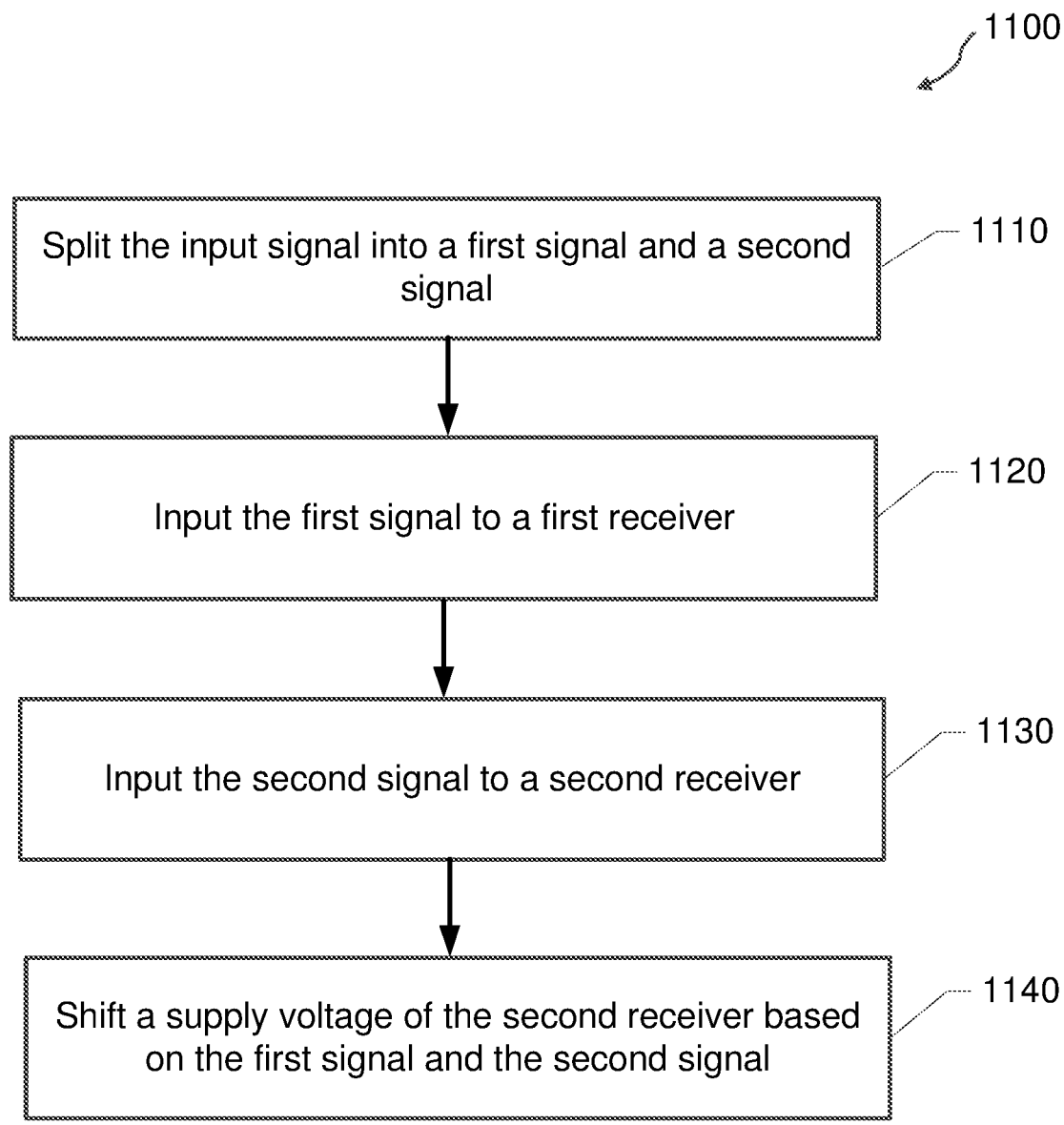
FIG. 11 is a flowchart illustrating a method of receiving an input signal according to certain aspects of the present disclosure.

FIG. 11 illustrates a method 1100 of receiving an input signal according to certain aspects.

At block 1110, the input signal is split into a first signal and a second signal. For example, the input signal may be split into the first signal (e.g., SIG_LV) and the second signal (e.g., SIG_HV) by the splitter 120. In certain aspects, the input signal has a first voltage swing (e.g., 1.8 V), the first signal has a second voltage swing (e.g., 0.9 V), the second signal has a third voltage swing (e.g., 0.9 V), and each one of the second voltage swing and the third voltage swing is less than the first voltage swing.

At block 1120, the first signal in input to a first receiver. For example, the first receiver may correspond to the first receiver 130.

At block 1130, the second signal is input to a second receiver. For example, the second receiver may correspond to the second receiver 150.

At block 1140, a supply voltage of the second receiver is shifted based on the first signal and the second signal. For example, the supply voltage (e.g., vss_out) may be shifted by the first boost circuit (e.g., first boost circuit 310). In certain aspects, the supply voltage is shifted during a transition of the input signal from low to high (e.g., transition 410). In certain aspects, the supply voltage is shifted lower.

In certain aspects, shifting the supply voltage of the second receiver during the transition of the input signal from low to high includes shifting the supply voltage of the second receiver between a time that the first signal crosses a first threshold (e.g., Th_start_VIH) and a time that the second signal crosses a second threshold (e.g., Th_end_VIH).

In certain aspects, the method includes shifting a supply voltage (e.g., vdd_out) of the first receiver based on the first signal and the second signal. In certain aspects, shifting the supply voltage of the first receiver includes shifting the supply voltage of the first receiver during a transition of the input signal from high to low (e.g., transition 420). In certain aspects, shifting the supply voltage of the first receiver during the transition of the input signal from high to low includes shifting the supply voltage of the first receiver between a time that the second signal crosses a first threshold (Th_start_VIL) and a time that the first signal crosses a second threshold (e.g., Th_end_VIL). In certain aspects, shifting the supply voltage of the first receiver includes shifting the supply voltage higher.

It is to be appreciated that a split receiver may also be referred to as a receiving circuit or another term.

It is also to be appreciated that the first threshold Th_start_VIL and the second threshold Th_end_VIL may also be referred to as the third threshold and the fourth threshold, respectively, for a receiving circuit including both the first boost circuit 310 and the second boost circuit 320.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

It is to be appreciated that an n-type field effect transistor may also be referred to as an n-channel field effect transistor and a p-type field effect transistor may also be referred to as a p-channel field effect transistor. It is to be appreciated that the source and the drain of a transistor may each also be referred to as a terminal, and that the gate of a transistor may also be referred to as a control terminal.

Implementation examples are described in the following numbered clauses:

1. A receiving circuit, comprising:
a splitter having a first output and a second output, wherein the splitter is configured to receive an input signal, split the input signal into a first signal and a second signal, output the first signal at the first output, and output the second signal at the second output;
a first receiver having an input and an output, wherein the input of the first receiver is coupled to the first output of the splitter; and
a second receiver having an input and an output, wherein the input of the second receiver is coupled to the second output of the splitter; and
a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver.

2. The receiving circuit of clause 1, wherein the first boost circuit is configured to shift a supply voltage of the second receiver based on the first signal and the second signal.

3. The receiving circuit of clause 2, wherein the first boost circuit is configured to shift the supply voltage of the second receiver during a transition of the input signal from low to high.

4. The receiving circuit of clause 2 or 3, wherein the first boost circuit is configured to shift the supply voltage of the second receiver between a time that the first signal crosses a first threshold and a time that the second signal crosses a second threshold.

5. The receiving circuit of any one of clauses 2 to 4, wherein the first boost circuit is configured to shift the supply voltage of the second receiver lower.

6. The receiving circuit of any one of clauses 1 to 5, further comprising a second boost circuit having a first input, a second input, and an output, wherein the first input of the second boost circuit is coupled to the input of the first receiver, the second input of the second boost circuit is coupled to the input of the second receiver, and the output of the second boost circuit is coupled to a supply terminal of the first receiver.

7. The receiving circuit of clause 6, wherein the second boost circuit is configured to shift a supply voltage of the first receiver based on the first signal and the second signal.

8. The receiving circuit of clause 7, wherein the second boost circuit is configured to shift the supply voltage of the first receiver during a transition of the input signal from high to low.

9. The receiving circuit of clause 7 or 8, wherein the second boost circuit is configured to shift the supply voltage of the first receiver between a time that the second signal crosses a first threshold and a time that the first signal crosses a second threshold.

10. The receiving circuit of any one of clauses 7 to 9, wherein the second boost circuit is configured to shift the supply voltage of the first receiver higher.

11. The receiving circuit of any one of clauses 1 to 10, further comprising a first logic decision circuit having a first input, a second input, and an output, wherein the first input of the first logic decision circuit is coupled to the output of the first receiver, and the second input of the first logic decision circuit is coupled to the output of the second receiver.

12. The receiving circuit of clause 11, wherein the first logic decision circuit is configured to:
output a first logic value when both the first receiver and the second receiver output a logic zero; and
output a second logic value when both the first receiver and the second receiver output a logic one.

13. The receiving circuit of clause 11 or 12, further comprising a second logic decision circuit having a first input, a second input, and an output, wherein the first input of the second logic decision circuit is coupled to the output of the first receiver, and the second input of the second logic decision circuit is coupled to the output of the second receiver,
wherein the output of the first logic decision circuit is configured to output a signal in a first voltage domain, and the output of the second logic decision circuit is configured to output a signal in a second voltage domain that is different from the first voltage domain.

14. The receiving circuit of any one of clauses 1 to 13, wherein:

the first boost circuit comprises a control circuit and a voltage circuit;

the control circuit has a first input, a second input, and an output;

the voltage circuit has an input and an output, the first input of the control circuit is coupled to the input of the first receiver, the second input of the control circuit is coupled to the input of the second receiver, and the output of the control circuit is coupled to the input of the voltage circuit; and the output of the voltage circuit is coupled to the supply terminal of the second receiver.

15. The receiving circuit of clause 14, wherein the voltage circuit comprises:

a first transistor having a first terminal, a second terminal, and a control terminal, wherein the first terminal is coupled to the supply terminal of the second receiver, the second terminal is coupled to a first supply voltage, and the control terminal is coupled to the output of the control circuit;

a second transistor having a first terminal, a second terminal, and a control terminal, wherein the first terminal is coupled to a second supply voltage, and the control terminal is coupled to the output of the control circuit;

a third transistor having a first terminal, a second terminal, and a control terminal, wherein the first terminal is coupled to a third supply voltage, the second terminal is coupled to the supply terminal of the second receiver, and the control terminal is coupled to the first supply voltage; and a resistor coupled between the supply terminal of the second receiver and the second terminal of the second transistor.

16. The receiving circuit of clause 6, wherein:

the second boost circuit comprises a control circuit and a voltage circuit;

the control circuit has a first input, a second input, and an output;

the voltage circuit has an input and an output, the first input of the control circuit is coupled to the input of the first receiver, the second input of the control circuit is coupled to the input of the second receiver, and the output of the control circuit is coupled to the input of the voltage circuit; and the output of the voltage circuit is coupled to the supply terminal of the first receiver.

17. The receiving circuit of clause 16, wherein the second circuit comprises:

a first transistor having a first terminal, a second terminal, and a control terminal, where the first terminal is coupled to the supply terminal of the first receiver, the second terminal is coupled to a first supply voltage, and the control terminal is coupled to the output of the control circuit;

a second transistor having a first terminal, a second terminal, and a control terminal, wherein the first terminal is coupled to a second supply voltage, and the control terminal is coupled to the output of the control circuit;

a third transistor having a first terminal, a second terminal, and a control terminal, wherein the first terminal is coupled to a third supply voltage, the second terminal is coupled to the supply terminal of the first receiver, and the control terminal is coupled to the first supply voltage; and a resistor coupled between the supply terminal of the first receiver and the second terminal of the second transistor.

18. The receiving circuit of any one of clauses 1 to 17, wherein the input signal has a first voltage swing, the first signal has a second voltage swing, the second signal has a third voltage swing, and each one of the second voltage swing and the third voltage swing is less than the first voltage swing.

19. The receiving circuit of any one of clauses 1 to 18, wherein a voltage of the second signal is higher than a voltage of the first signal.

20. A receiving circuit, comprising:

a splitter having a first output and a second output, wherein the splitter is configured to receive an input signal, split the input signal into a first signal and a second signal, output the first signal at the first output, and output the second signal at the second output;

a first receiver having an input and an output, wherein the input of the first receiver is coupled to the first output of the splitter;

a second receiver having an input and an output, wherein the input of the second receiver is coupled to the second output of the splitter;

a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver; and a second boost circuit having a first input, a second input, and an output, wherein the first input of the second boost circuit is coupled to the input of the first receiver, the second input of the second boost circuit is coupled to the input of the second receiver, and the output of the second boost circuit is coupled to a supply terminal of the first receiver.

21. The receiving circuit of clause 20, wherein:

the first boost circuit is configured to output a first supply voltage to the supply terminal of the second receiver, and to shift the first supply voltage based on the first signal and the second signal; and the second boost circuit is configured to output a second supply voltage to the supply terminal of the first receiver, and to shift the second supply voltage based on the first signal and the second signal.

22. The receiving circuit of clause 21, wherein:

the first boost circuit is configured to shift the first supply voltage during a transition of the input signal from low to high; and the second boost circuit is configured to shift the second supply voltage during a transition of the input signal from high to low.

23. The receiving circuit of clause 21 or 22, wherein:

the first boost circuit is configured to shift the first supply voltage between a time that the first signal crosses a first threshold and a time that the second signal crosses a second threshold; and the second boost circuit is configured to shift the supply voltage of the second supply voltage between a time that the second signal crosses a third threshold and a time that the first signal crosses a fourth threshold.

24. The receiving circuit of any one of clauses 21 to 23, wherein:

the first boost circuit is configured to shift the first supply voltage lower; and the second boost circuit is configured to shift the second supply voltage higher.

25. The receiving circuit of any one of clauses 20 to 24, further comprising a logic decision circuit having a first input, a second input, and an output, wherein the first input of the logic decision circuit is coupled to the output of the first receiver, and the second input of the logic decision circuit is coupled to the output of the second receiver.

26. The receiving circuit of clause 25, wherein the logic decision circuit is configured to:
output a first logic value when both the first receiver and the second receiver output a logic zero; and
output a second logic value when both the first receiver and the second receiver output a logic one.

27. The receiving circuit of any one of clauses 20 to 27, wherein the input signal has a first voltage swing, the first signal has a second voltage swing, the second signal has a third voltage swing, and each one of the second voltage swing and the third voltage swing is less than the first voltage swing.

28. A method of receiving an input signal, comprising:
splitting the input signal into a first signal and a second signal;
inputting the first signal to a first receiver;
inputting the second signal to a second receiver; and
shifting a supply voltage of the second receiver based on the first signal and the second signal.

29. The method of clause 28, wherein shifting the supply voltage of the second receiver comprises shifting the supply voltage of the second receiver during a transition of the input signal from low to high.

30. The method of clause 29, wherein shifting the supply voltage of the second receiver during the transition of the input signal from low to high comprises shifting the supply voltage of the second receiver between a time that the first signal crosses a first threshold and a time that the second signal crosses a second threshold.

31. The method of any one of clauses 28 to 30, wherein shifting the supply voltage of the second receiver comprises shifting the supply voltage of the second receiver lower.

32. The method of any one of clauses 28 to 31, further comprising shifting a supply voltage of the first receiver based on the first signal and the second signal.

33. The method of clause 32, wherein shifting the supply voltage of the first receiver comprises shifting the supply voltage of the first receiver during a transition of the input signal from high to low.

34. The method of clause 33, wherein shifting the supply voltage of the first receiver during the transition of the input signal from high to low comprises shifting the supply voltage of the first receiver between a time that the second signal crosses a first threshold and a time that the first signal crosses a second threshold.

35. The method of any one of clauses 32 to 34, wherein shifting the supply voltage of the first receiver comprises shifting the supply voltage of the first receiver higher.

36. The method of any one of clauses 28 to 35, wherein the input signal has a first voltage swing, the first signal has a second voltage swing, the second signal has a third voltage swing, and each one of the second voltage swing and the third voltage swing is less than the first voltage swing.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A receiving circuit, comprising:
a splitter having a first output and a second output, wherein the splitter is configured to receive an input signal, split the input signal into a first signal and a second signal, output the first signal at the first output, and output the second signal at the second output;
a first receiver having an input and an output, wherein the input of the first receiver is coupled to the first output of the splitter;
a second receiver having an input and an output, wherein the input of the second receiver is coupled to the second output of the splitter; and
a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver.

2. The receiving circuit of claim 1, wherein the first boost circuit is configured to shift a supply voltage of the second receiver based on the first signal and the second signal.

3. The receiving circuit of claim 2, wherein the first boost circuit is configured to shift the supply voltage of the second receiver during a transition of the input signal from low to high.

4. The receiving circuit of claim 2, wherein the first boost circuit is configured to shift the supply voltage of the second receiver between a time that the first signal crosses a first threshold and a time that the second signal crosses a second threshold.

5. The receiving circuit of claim 2, wherein the first boost circuit is configured to shift the supply voltage of the second receiver lower.

6. The receiving circuit of claim 1, further comprising a second boost circuit having a first input, a second input, and an output, wherein the first input of the second boost circuit is coupled to the input of the first receiver, the second input of the second boost circuit is coupled to the input of the second receiver, and the output of the second boost circuit is coupled to a supply terminal of the first receiver.

7. The receiving circuit of claim 6, wherein the second boost circuit is configured to shift a supply voltage of the first receiver based on the first signal and the second signal.

8. The receiving circuit of claim 7, wherein the second boost circuit is configured to shift the supply voltage of the first receiver during a transition of the input signal from high to low.

9. The receiving circuit of claim 7, wherein the second boost circuit is configured to shift the supply voltage of the first receiver between a time that the second signal crosses a first threshold and a time that the first signal crosses a second threshold.

10. The receiving circuit of claim 7, wherein the second boost circuit is configured to shift the supply voltage of the first receiver higher.

11. The receiving circuit of claim 1, further comprising a logic decision circuit having a first input, a second input, and an output, wherein the first input of the logic decision circuit is coupled to the output of the first receiver, and the second input of the logic decision circuit is coupled to the output of the second receiver.

12. The receiving circuit of claim 11, wherein the logic decision circuit is configured to:
output a first logic value when both the first receiver and the second receiver output a logic zero; and
output a second logic value when both the first receiver and the second receiver output a logic one.

13. The receiving circuit of claim 1, wherein the input signal has a first voltage swing, the first signal has a second voltage swing, the second signal has a third voltage swing, and each one of the second voltage swing and the third voltage swing is less than the first voltage swing.

14. A receiving circuit, comprising:
a splitter having a first output and a second output, wherein the splitter is configured to receive an input signal, split the input signal into a first signal and a second signal, output the first signal at the first output, and output the second signal at the second output;
a first receiver having an input and an output, wherein the input of the first receiver is coupled to the first output of the splitter;
a second receiver having an input and an output, wherein the input of the second receiver is coupled to the second output of the splitter;
a first boost circuit having a first input, a second input, and an output, wherein the first input of the first boost circuit is coupled to the input of the first receiver, the second input of the first boost circuit is coupled to the input of the second receiver, and the output of the first boost circuit is coupled to a supply terminal of the second receiver; and
a second boost circuit having a first input, a second input, and an output, wherein the first input of the second boost circuit is coupled to the input of the first receiver, the second input of the second boost circuit is coupled to the input of the second receiver, and the output of the second boost circuit is coupled to a supply terminal of the first receiver.

15. The receiving circuit of claim 14, wherein:
the first boost circuit is configured to output a first supply voltage to the supply terminal of the second receiver, and to shift the first supply voltage based on the first signal and the second signal; and
the second boost circuit is configured to output a second supply voltage to the supply terminal of the first receiver, and to shift the second supply voltage based on the first signal and the second signal.

16. The receiving circuit of claim 15, wherein:
the first boost circuit is configured to shift the first supply voltage during a transition of the input signal from low to high; and
the second boost circuit is configured to shift the second supply voltage during a transition of the input signal from high to low.

17. The receiving circuit of claim 15, wherein:
the first boost circuit is configured to shift the first supply voltage between a time that the first signal crosses a first threshold and a time that the second signal crosses a second threshold; and
the second boost circuit is configured to shift the supply voltage of the second supply voltage between a time that the second signal crosses a third threshold and a time that the first signal crosses a fourth threshold.

18. The receiving circuit of claim 15, wherein:
the first boost circuit is configured to shift the first supply voltage lower; and
the second boost circuit is configured to shift the second supply voltage higher.

19. The receiving circuit of claim 14, further comprising a logic decision circuit having a first input, a second input, and an output, wherein the first input of the logic decision circuit is coupled to the output of the first receiver, and the second input of the logic decision circuit is coupled to the output of the second receiver.

20. The receiving circuit of claim 19, wherein the logic decision circuit is configured to:
output a first logic value when both the first receiver and the second receiver output a logic zero; and
output a second logic value when both the first receiver and the second receiver output a logic one.

21. The receiving circuit of claim 14, wherein the input signal has a first voltage swing, the first signal has a second voltage swing, the second signal has a third voltage swing, and each one of the second voltage swing and the third voltage swing is less than the first voltage swing.

22. A method of receiving an input signal, comprising:
splitting the input signal into a first signal and a second signal;
inputting the first signal to a first receiver;
inputting the second signal to a second receiver; and
shifting a supply voltage of the second receiver based on the first signal and the second signal.

23. The method of claim 22, wherein shifting the supply voltage of the second receiver comprises shifting the supply voltage of the second receiver during a transition of the input signal from low to high.

24. The method of claim 23, wherein shifting the supply voltage of the second receiver during the transition of the input signal from low to high comprises shifting the supply voltage of the second receiver between a time that the first signal crosses a first threshold and a time that the second signal crosses a second threshold.

25. The method of claim 22, wherein shifting the supply voltage of the second receiver comprises shifting the supply voltage of the second receiver lower.

26. The method of claim 22, further comprising shifting a supply voltage of the first receiver based on the first signal and the second signal.

27. The method of claim 26, wherein shifting the supply voltage of the first receiver comprises shifting the supply voltage of the first receiver during a transition of the input signal from high to low.

28. The method of claim 27, wherein shifting the supply voltage of the first receiver during the transition of the input signal from high to low comprises shifting the supply voltage of the first receiver between a time that the second signal crosses a first threshold and a time that the first signal crosses a second threshold.

29. The method of claim 26, wherein shifting the supply voltage of the first receiver comprises shifting the supply voltage of the first receiver higher.

30. The method of claim 22, wherein the input signal has a first voltage swing, the first signal has a second voltage swing, the second signal has a third voltage swing, and each one of the second voltage swing and the third voltage swing is less than the first voltage swing.

* * * * *